United States Patent
Suzuki et al.

(10) Patent No.: US 8,787,601 B2
(45) Date of Patent: Jul. 22, 2014

(54) CONDENSER MICROPHONE

(75) Inventors: Toshihisa Suzuki, Hamamatsu (JP);
Yukitoshi Suzuki, Hamamatsu (JP);
Nariyasu Yaguchi, Hamamatsu (JP);
Kazushi Sakurauchi, Hamamatsu (JP)

(73) Assignee: Yamaha Corporation, Hamamatsu-Shi, Shizuoka-Ken (JP)

( * ) Notice: Subject to any disclaimer, the term of this patent is extended or adjusted under 35 U.S.C. 154(b) by 1621 days.

(21) Appl. No.: 11/677,465

(22) Filed: Feb. 21, 2007

(65) Prior Publication Data

US 2007/0201709 A1 Aug. 30, 2007

(30) Foreign Application Priority Data

Feb. 24, 2006 (JP) ............................... P2006-048183
Mar. 6, 2006 (JP) ............................... P2006-059041
Mar. 31, 2006 (JP) ............................... P2006-096703

(51) Int. Cl.
*H04R 25/00* (2006.01)

(52) U.S. Cl.
USPC ........... 381/175; 381/174; 381/113; 381/190; 381/191; 381/178; 367/181; 367/170; 367/178; 367/163; 367/174

(58) Field of Classification Search
CPC ........ H04R 25/00; H04R 11/02; H04R 11/04; H04R 19/005; H04R 19/04; B81B 3/0072
USPC ......... 381/413, 174, 175, 191, 190, 113, 178; 367/181, 170, 178, 163, 174
See application file for complete search history.

(56) References Cited

U.S. PATENT DOCUMENTS

| | | | | |
|---|---|---|---|---|
| 5,452,268 A | * | 9/1995 | Bernstein | 367/181 |
| 5,677,965 A | * | 10/1997 | Moret et al. | 381/191 |
| 6,535,460 B2 | * | 3/2003 | Loeppert et al. | 367/181 |
| 7,620,192 B2 | * | 11/2009 | Yamaoka et al. | 381/175 |
| 2002/0067663 A1 | * | 6/2002 | Loeppert et al. | 367/181 |
| 2008/0019543 A1 | * | 1/2008 | Suzuki et al. | 381/174 |

FOREIGN PATENT DOCUMENTS

| | | |
|---|---|---|
| JP | 2001-231099 | 8/2001 |
| JP | 2001-518246 | 10/2001 |
| JP | 2002-95093 | 3/2002 |

* cited by examiner

*Primary Examiner* — Davetta W Goins
*Assistant Examiner* — Jasmine Pritchard
(74) *Attorney, Agent, or Firm* — Dickstein Shapiro LLP

(57) ABSTRACT

A condenser microphone includes a substrate having a cavity, first and second spacers defining an opening, a diaphragm having a rectangular shape positioned inside of the opening, and a plate having a rectangular shape positioned just above the diaphragm. Plate joint portions integrally interconnected with two sides of the plate are directly attached onto the second spacer. Supports, which are attached onto the second spacer across the opening and project inwardly of the opening, are connected to the prescribed portions of the diaphragm via third spacers relatively to the other two sides of the plate. The center portion of the diaphragm can be designed in a multilayered structure, and the peripheral portion can be bent outwardly. In addition, both ends of the diaphragm are fixed in position, while free ends of the diaphragm vibrate due to sound waves.

8 Claims, 29 Drawing Sheets (A1)

(A2)

(A3)

(A4)

(A5)

(A6)

(A7)

(B1)

(B2)

(B3)

(B4)

(B5)

(B6)

(B7)

(C1)

(C2)

(C3)

(C4)

(C5)

(C6)

(C7)

FIG. 14A
FIG. 14B
FIG. 14C
FIG. 14D
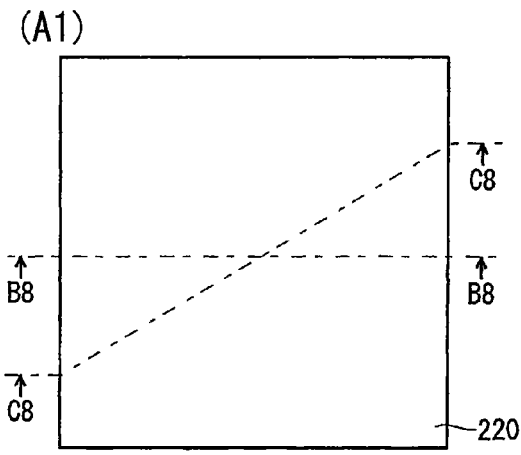
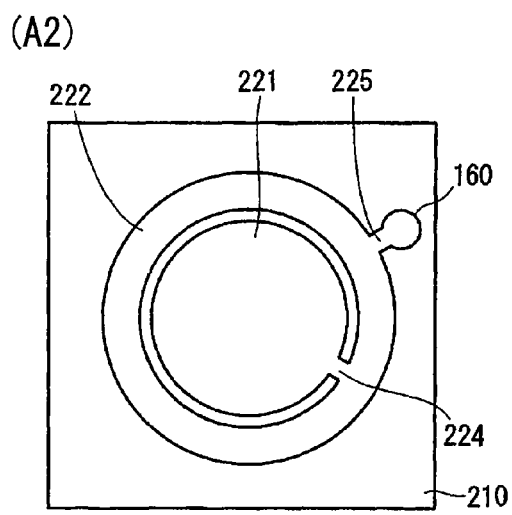
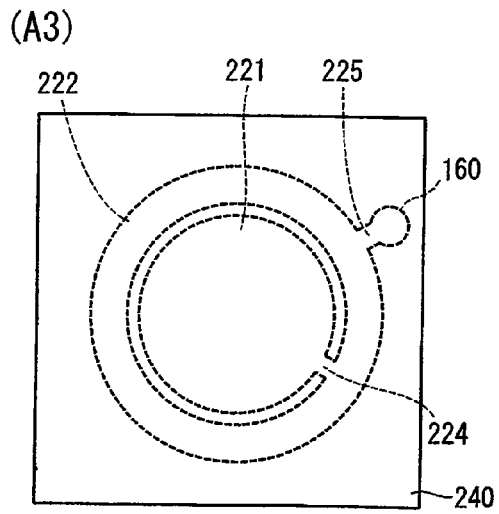
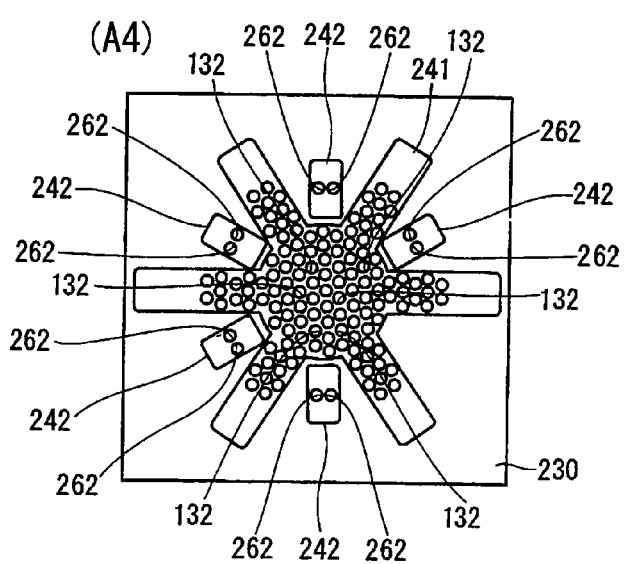

(A5)

(A6)

(B1)

(B2)

(B3)

(B4)

(B5)

(B6)

FIG. 16A
(C1)
FIG. 16B
(C2)
FIG. 16C
(C3)
FIG. 16D
(C4)
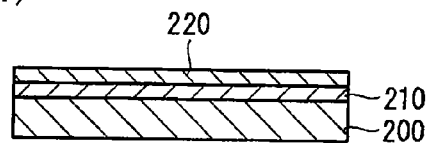
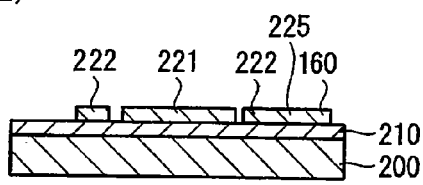
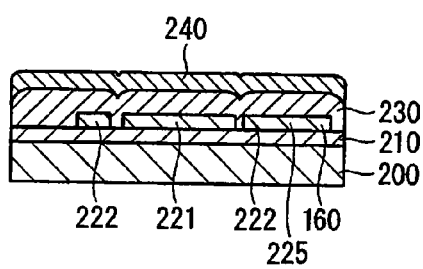
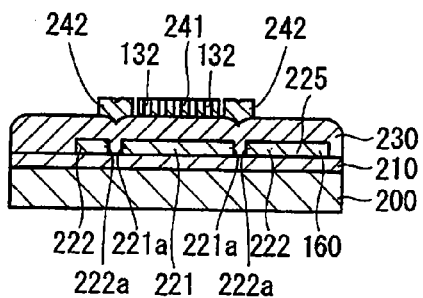
FIG. 16E
(C5)
FIG. 16F
(C6)
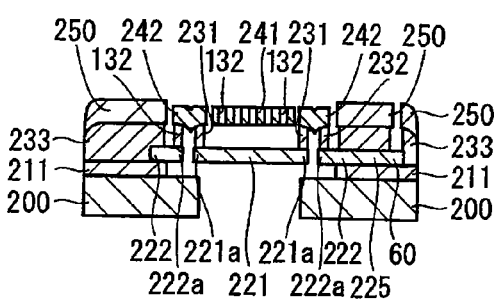
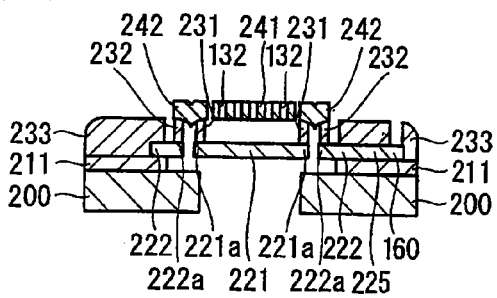

(A1)

(A2)

(A3)

(A4)

(A5)

(A6)

(A7)

(B1)

(B2)

(B3)

(B4)

(B5)

(B6)

(B7)

(C1)

(C2)

(C3)

(C4)

(C5)

(C6)

(C7)

CONDENSER MICROPHONE

TECHNICAL FIELD

The present invention relates to condenser microphones (or capacitor microphones) having diaphragms adapted to microelectromechanical systems (MEMS). The present invention also relates to manufacturing methods of condenser microphones and manufacturing methods of diaphragms included in condenser microphones.

This application claims priority on Japanese Patent Application No. 2006-96703 (filed Mar. 31, 2006), Japanese Patent Application No. 2006-59041 (filed Mar. 6, 2006), and Japanese Patent Application No. 2006-48183 (filed Feb. 24, 2006), the contents of which are incorporated herein by reference.

BACKGROUND ART

Conventionally, various types of condenser microphones (or capacitor microphones) have been developed and produced by way of manufacturing processes of semiconductor devices. A typical example of a condenser microphone includes a diaphragm, which vibrates due to sound waves, and a plate, which is positioned opposite to the diaphragm via a dielectric such as air. An electrostatic capacitance (or capacity) formed by the diaphragm and the plate varies due to vibration of the diaphragm. The condenser microphone converts variations of electrostatic capacitance into electric signals.

Japanese Patent Application Publication No. 2001-518246 teaches a miniature silicon condenser microphone in which a diaphragm is fixed in a cantilever manner. This condenser microphone has a structure in which tensile stress, which occurs during the formation of the diaphragm, does not remain; hence, it is advantageous in that the amplitude of the diaphragm due to sound pressure applied thereto can be increased, whereas the strength of the diaphragm is decreased, so that a stopper is necessary to prevent an excessive amplitude in the diaphragm. This makes the manufacturing process complicated.

Japanese Unexamined Patent Application Publication No. 2002-95093 teaches a condenser microphone in which the peripheral portion of a diaphragm is entirely fixed in position, wherein the overall area of the diaphragm having conductivity is positioned opposite to a plate having conductivity. The peripheral portion of the diaphragm causes very small amplitude so that substantially no variation occurs in capacity, wherein the ratio of the capacity of the peripheral portion of the diaphragm becomes large within the total capacity of the condenser microphone. This degrades the sensitivity of the condenser microphone. Due to the fixing of the peripheral portion of the diaphragm, tensile stress, which remains during the formation of the diaphragm, is not released so that the amplitude of the diaphragm due to sound pressure applied thereto is reduced.

Japanese Unexamined Patent Application Publication No. 2001-231099 teaches an example of an electroacoustic transducer, i.e., a condenser microphone in which four corners of a diaphragm are fixed in position, wherein the diaphragm having conductivity is positioned opposite to a plate having conductivity. The peripheral portion of the diaphragm causes very small amplitude so that substantially no variation in capacity occurs, wherein the ratio of the capacity of the peripheral portion of the diaphragm becomes large within the total capacity of the condenser microphone. This degrades the sensitivity of the condenser microphone. Fixing the four corners of the diaphragm reduces the amplitude of the diaphragm due to sound pressure applied thereto.

Specifically, the aforementioned publication teaches a condenser microphone having a bent portion between the center portion and peripheral portion of a diaphragm. Herein, residual stress applied to the diaphragm is released by way of the deformation of the bent portion so that the amplitude of the diaphragm increases so as to increase the sensitivity. The bent portion is formed using a single thin film, which is generally deposited on the surface of a step portion formed in a sacrifice layer; hence, the thickness thereof becomes small as it approaches the bottom of the step portion because the step portion is difficult to be deposited and is thus reduced in density. That is, the strength of the diaphragm decreases as the height difference of the step portion increases. In other words, it is very difficult to increase the sensitivity by increasing the height difference of the bent portion while maintaining the satisfactory strength of the diaphragm.

DISCLOSURE OF INVENTION

It is an object of the present invention to provide a condenser microphone having a high sensitivity, which can be easily produced by way of a simple semiconductor manufacturing process.

It is another object of the present invention to provide a condenser microphone and its manufacturing method, which realizes a high sensitivity by use of a diaphragm whose bent portion has a high strength.

In a first aspect of the present invention, a condenser microphone includes a substrate having a cavity, a first spacer formed by means of a first film deposited on the substrate, a second spacer formed by means of a third film having an insulating ability deposited on the first spacer, an opening, which runs through the first spacer and the second spacer so as to communicate the cavity, a diaphragm formed by means of a second film having a conductivity formed between the first film and the third film, and a plate formed by means of a fourth film having a conductivity deposited on the third film. The diaphragm is positioned inside of the opening and is slightly distanced from the first and second spacers. The plate is formed in a rectangular shape, which is defined by a first pair of opposite sides and a second pair of opposite sides, and is positioned substantially in parallel with the diaphragm, wherein the first pair of opposite sides are fixed to the second spacer, and the second pair of opposite sides are positioned within the range of the diaphragm in plan view. In addition, a pair of supports are formed by means of the fourth film and are attached on the second spacer so as to project inwardly of the opening. Furthermore, a pair of third spacers is distanced from the first and second spacers and positioned inside of the opening, wherein the third spacers join between the projecting portions of the supports and the prescribed portions of the diaphragm relative to the second pair of opposite sides of the plate.

In the above, the diaphragm is slightly distanced from the first and second spacers defining the opening; the upper ends of the third spacers are attached to the projecting portions of the supports, which project inwardly of the opening; and the lower ends of the third spacers are attached to the prescribed portions of the diaphragm relative to the second pair of opposite sides of the plate. By appropriately adjusting the thickness of the third film forming the third spacers, it is possible to adjust the distances (or heights) between the prescribed portions of the diaphragm and the projecting portions of the supports. As the thickness of the third film becomes large, the internal stress of the second film, which remains after the formation of the second film forming the diaphragm, greatly influences the lower ends of the third spacers in terms of torque. In response to the torque exerted on the lower ends of the third spacers, the third spacers slightly rotate so as to cause the deformation of the supports. Due to the deformation of the supports caused by the rotation of the third spacers in response to the internal stress of the second film, it is possible to release the internal stress of the diaphragm. The condenser microphone is designed such that two sides of the diaphragm are only fixed in position; hence, it is possible to increase the amplitude of the diaphragm due to sound pressure applied thereto in comparison with the conventionally-known condenser microphone in which the peripheral portion of a diaphragm is entirely fixed in position. The amplitude occurring on the other two sides of the diaphragm joining the third spacers is smaller than the amplitude occurring on the center portion of the diaphragm. Hence, when the plate is positioned in proximity to the other two sides of the diaphragm, the ratio of a fixed capacity that does not substantially change within the total capacity formed between the plate and the diaphragm becomes high. In contrast, the condenser microphone is designed such that only the first pair of opposite sides of the plate are fixed to the second spacer; hence, the second pair of opposite sides of the plate are positioned inside of the range defined by the other two sides of the diaphragm joining the third spacers. This reduces the ratio of the fixed capacity within the total capacity formed between the plate and the diaphragm. That is, it is possible to increase the sensitivity of the condenser microphone. Both of the plate and the supports are formed by means of the fourth film; and the third film forming the third spacers is inserted between the fourth film forming the plate and the second film forming the diaphragm. That is, the condenser microphone is produced with a simple structure, which can be easily realized by way of patterning forming essential films thereof.

In addition, the condenser microphone is designed such that the cavity is substantially covered with the diaphragm, and the first film has an insulating ability. The condenser microphone further includes a pair of plate joint portions, which are formed by means of the fourth film and are integrally interconnected with the first pair of opposite sides of the plate, a pair of guard electrodes, which are formed by means of the second film and which are slightly distanced from the diaphragm and are inserted between the plate joint portions and the substrate, a first circuit element for placing the guard electrodes and the plate at substantially the same potential, and a second circuit element for placing the substrate and the diaphragm at substantially the same potential.

Since the diaphragm substantially covers the cavity of the substrate, sound waves propagate through the opening (which runs through the first and second spacers) to reach the diaphragm, while they slightly propagate into the cavity via the external portion of the diaphragm. That is, the propagation path allowing sound waves to propagate into the cavity via the external portion of the diaphragm has a relatively high acoustic resistance. In comparison with the conventional condenser microphone in which sound waves directly propagate into the cavity, it is possible to increase the energy of sound applied to the diaphragm, thus noticeably improving the sensitivity. Since the condenser microphone is designed such that the substrate and the diaphragm are placed at substantially the same potential, it is possible to cancel the capacity formed between the diaphragm and the substrate. Since the plate is placed at substantially the same potential with the guard electrodes, which are formed between the plate and the substrate, it is possible to cancel the capacity formed between the plate and the guard electrodes.

Furthermore, the diaphragm has a rectangular shape defined by a pair of long sides and a pair of short sides, wherein the long sides of the diaphragm are positioned in parallel with the first pair of opposite sides of the plate, and the short sides of the diaphragm are positioned in parallel with the second pair of opposite sides of the plate. This allows the diaphragm to vibrate and to be vertically bent together with the long sides. That is, it is possible to increase the amplitude of the diaphragm in comparison with another technology in which the diaphragm vibrates and is vertically bent together with the short sides thereof.

In a second aspect of the present invention, a diaphragm is manufactured by way of the steps of: patterning a first film so as to form a center portion of the diaphragm; forming a second film on a near-end portion of the first film by way of deposition; and patterning a third film on the second film so that the third film is extended outwardly of the first film so as to form a bent portion of the diaphragm having a multilayered structure including the first, second, and third films, wherein the bent portion is extended outwardly of the center portion of the diaphragm.

In the above, the bent portion is formed externally of the center portion of the diaphragm without bending the first, second, and third films, wherein a crystal grain boundary is not formed in the bent portion of the diaphragm. The step difference (or height) of the bent portion having a multilayered structure including the first, second, and third films, can be easily controlled by controlling the thickness of the second film, for example. That is, it is possible to form the bent portion having a desired step difference externally of the center portion of the diaphragm while maintaining the satisfactory strength of the diaphragm.

The aforementioned manufacturing method is adapted to a condenser microphone including a plate having a fixed electrode, a diaphragm causing vibration due to sound waves applied thereto, in which a center portion has a moving electrode, and a bent portion is formed and extended outwardly of the center portion, and a plurality of supports which support the plate and the bent portion of the diaphragm in such a way that an air gap is formed between the fixed electrode and the moving electrode. Accordingly, it is possible to form a high-strength diaphragm whose bent portion has a desired step difference. The bent portion, which is positioned between the center portion and the peripheral portion of the diaphragm fixed to the supports, is deformed due to residual stress of the center portion of the diaphragm; hence, it is possible to release the residual stress of the center portion of the diaphragm; and it is possible to increase the amplitude of vibration occurring on the center portion of the diaphragm, which is greatly deformed due to sound waves applied thereto. Thus, it is possible to produce a highly sensitive condenser microphone having a high-strength diaphragm.

In addition, the plate can be formed using the third film. In this case, both of the plate and the bent portion of the diaphragm are produced by way of the formation of the third film; hence, it is possible to simplify the manufacturing method of the condenser microphone.

In a third aspect of the present invention, a condenser microphone includes a plate having a fixed electrode, a plurality of supports for supporting the plate, and a diaphragm having a moving electrode, which is positioned opposite to the plate with an air gap therebetween, wherein both ends of the diaphragm are supported by the supports, and wherein the diaphragm is partially deformed due to vibration caused by sound waves transmitted thereto. That is, the free ends of the diaphragm are displaced due to sound waves with a relatively large amplitude, which is larger than the amplitude of vibration occurring in the conventionally-known diaphragm whose periphery is entirely fixed in position. This increases the variable capacity of the condenser microphone; hence, it is possible to improve the sensitivity of the condenser microphone.

In the above, the diaphragm has a rectangular shape in which a pair of opposite ends are fixed to the supports, and another pair of opposite ends are positioned free from the supports so that the diaphragm is bridged across the supports. In addition, the diaphragm has a pair of springs, which are waved and expanded in a bridging direction from the center portion of the diaphragm to the pair of opposite ends fixed to the supports so as to absorb residual stress of the center portion by way of deformation thereof. Furthermore, the rectangular shape of the diaphragm is defined by short sides and long sides, wherein the long sides lie in a bridging direction from the center portion of the diaphragm to the pair of opposite ends fixed to the supports.

In addition, the plate three-dimensionally crosses the diaphragm inwardly of the pair of opposite ends fixed to the supports, so that a pair of opposite sides of the plate is positioned above the diaphragm and positioned free from the supports. This avoids the occurrence of electrostatic capacitance between the fixed ends of the diaphragm and the plate. This greatly reduces the unchanged capacity, which is not changed due to sound waves applied to the condenser microphone; hence, it is possible to improve the sensitivity of the condenser microphone.

Furthermore, the width of the diaphragm between the other pair of the opposite ends is reduced as it departs from the pair of the opposite ends of the diaphragm. Since another pair of opposite ends of the diaphragm is positioned free from the supports, the residual stress thereof is effectively reduced, whereby it is possible to prevent the other pair of opposite ends of the diaphragm from being slightly lowered in position.

BRIEF DESCRIPTION OF THE DRAWINGS

FIG. 14A is a plan view for explaining a first step of a manufacturing method of the condenser microphone;

FIG. 14B is a plan view for explaining a second step of the manufacturing method of the condenser microphone;

FIG. 14C is a plan view for explaining a third step of the manufacturing method of the condenser microphone;

FIG. 14D is a plan view for explaining a fourth step of the manufacturing method of the condenser microphone;

FIG. 16A is a cross-sectional view taken along line C8-C8 in FIG. 14A, which is used for explaining the first step of the manufacturing method of the condenser microphone;

FIG. 16B is a cross-sectional view for explaining the second step of the manufacturing method of the condenser microphone;

FIG. 16C is a cross-sectional view for explaining the third step of the manufacturing method of the condenser microphone;

FIG. 16D is a cross-sectional view for explaining the fourth step of the manufacturing method of the condenser microphone;

FIG. 16E is a cross-sectional view for explaining the fifth step of the manufacturing method of the condenser microphone;

FIG. 16F is a cross-sectional view for explaining the sixth step of the manufacturing method of the condenser microphone;

BEST MODE FOR CARRYING OUT THE INVENTION

The present invention will be described in further detail by way of examples with reference to the accompanying drawings.

1. First Embodiment

Figure 1A:
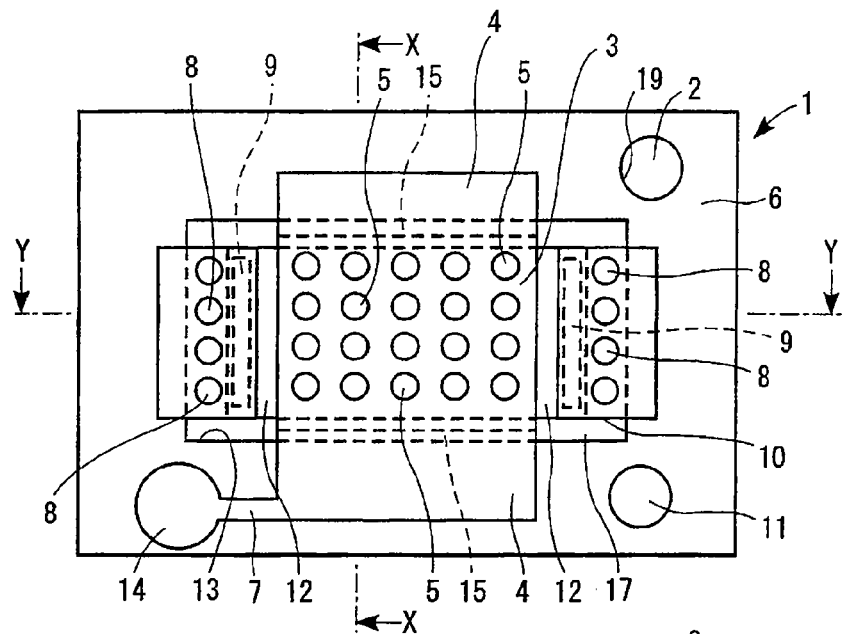
FIG. 1A is a plan view showing a sensing portion of a condenser microphone in accordance with a first embodiment of the present invention.
Figure 1B:
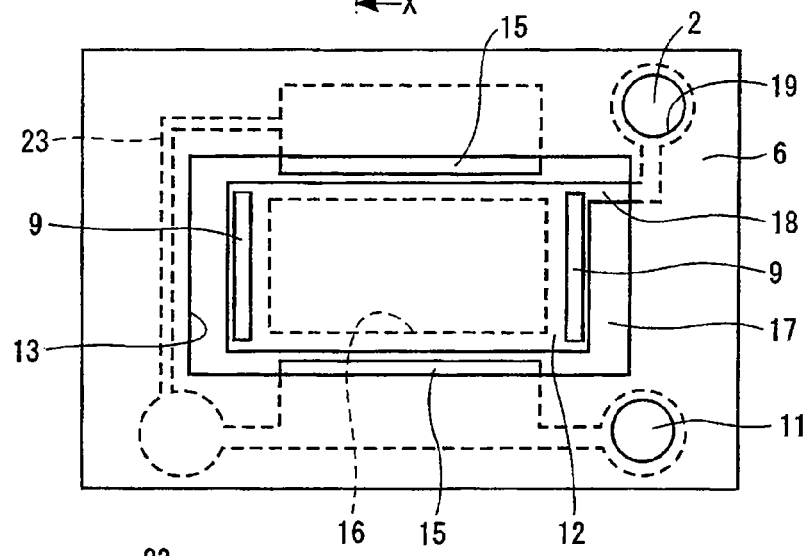
FIG. 1B is a plan view showing the sensing portion of the condenser microphone in which a plate and supports are excluded from the illustration of FIG. 1A.
Figure 1C:
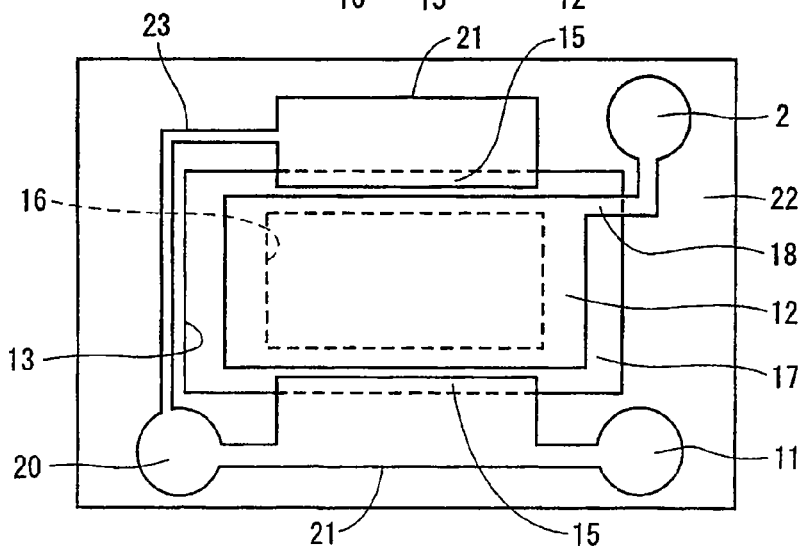
FIG. 1C is a plan view showing the sensing portion of the condenser microphone in which second and third spacers are excluded from the illustration of FIG. 1B.
Figure 2A:
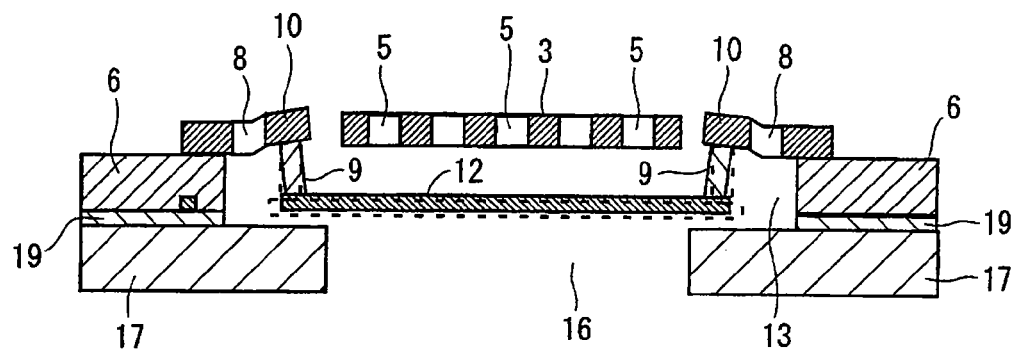
FIG. 2A is a cross-sectional view taken along line Y-Y in FIG. 1A.
Figure 2B:
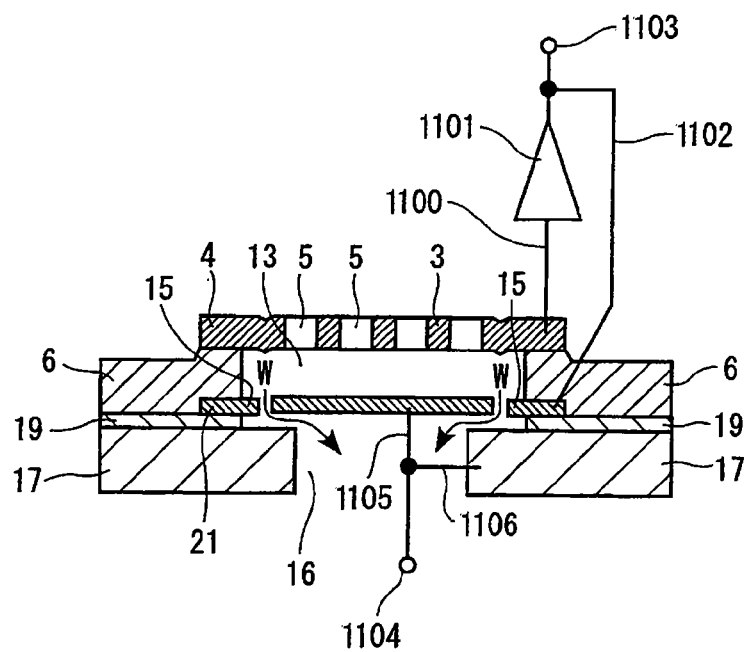
FIG. 2B is a cross-sectional view taken along line X-X in FIG. 1A.

A first embodiment is directed to a condenser microphone, i.e., a silicon capacitor microphone, which is produced by way of a semiconductor manufacturing process, wherein sound is transmitted to a diaphragm via a plate and is thus converted into electric signals. FIG. 1A, FIG. 2A, and FIG. 2B show a sensing portion of a condenser microphone 1; specifically, FIG. 1 is a plan view, FIG. 2A is a cross-sectional view taken along line Y-Y (showing a Y-axis direction), and FIG. 2B is a cross-sectional view taken along line X-X (showing an X-axis direction). FIG. 2B shows the circuitry of a detecting portion of the condenser microphone 1. FIG. 1B is a plan view of the condenser microphone 1 in which a plate 3 and a fourth film forming supports 10 are excluded from the illustration of FIG. 1A. FIG. 1C is a plan view of the condenser microphone 1 in which a third film forming a second spacer 6 and third spacers 9 is excluded from the illustration of FIG. 1B.

(a) Multilayered Structure of Sensing Portion

The sensing portion of the condenser microphone 1 has a multilayered structure (or a laminated structure) including a substrate 17, a first film, a second film, a third film, and a fourth film.

The substrate is composed of monocrystal silicon. A cavity 16 is formed in the substrate 17 in order to reduce the pressure, which is applied to a diaphragm 12 in a direction opposite to the progressing direction of sound waves.

The first film is an insulating thin film composed of silicon dioxide, which is deposited on the substrate 17. A first spacer 19, which is formed by means of the first film, supports the second film above the substrate 17 so that an air gap is formed between the diaphragm 12 and the substrate 17.

The second film, which is deposited on the first film, is a conductive thin film composed of polysilicon doped with impurities such as phosphorus (P). The diaphragm 12, which is formed by means of the second film, forms a movable electrode, which vibrates due to sound waves applied thereto. Guard electrodes 21, which are formed by means of the second film, are placed substantially at the same potential with plate joint portions 4, which will be described later.

The third film is deposited on the first film via the second film. Similar to the first film, the third film is an insulating thin film composed of silicon dioxide. The second spacer 6 and the third spacers 9, which are formed by means of the third film, support the fourth film so that an air gap is formed between the diaphragm 12 and a plate 3. The distance between the diaphragm 12 and the plate 3 is set to 4 μm or so, which substantially corresponds to the thickness of the third film, for example.

An opening 13 is formed to run through the first spacer 19 and the second spacer 6 and is communicated with the cavity 16.

The fourth film is deposited on the third film. Similar to the second film, the fourth film is a conductive thin film composed of polysilicon doped with impurities such as phosphorus (P). The plate 3, which is formed by means of the fourth film, forms a fixed electrode, which is positioned opposite to the diaphragm 12. Supports 10, which are formed by means of the fourth film, are formed at opposite sides of the opening 13, wherein the tip edges of the supports 10 project inwardly toward the opening 13 from the second spacer 6.

(b) Mechanical Structure of Sensing Portion

The diaphragm 12 is a rectangular film whose two sides are fixed by means of the supports 10 and the third spacers 9 and are lowered in position inside of the opening 13 so as to entirely cover the upper portion of the cavity 16. Specifically, there are provided two third spacers 9 that join the supports 10 and the diaphragm 12 so as to hang down the diaphragm 12, as follows:

The third spacers 9 are formed by means of prescribed parts of the third film deposited in proximity to short sides of the diaphragm 12. That is, the lower surfaces of the third spacers 9 join the diaphragm 12 such that they are positioned in proximity to two short sides positioned opposite to each other. The tip ends of the supports 10 correspond to prescribed parts of the fourth film deposited on the upper surfaces of the third spacers 9. That is, the upper surfaces of the third spacers 9 join the lower surfaces of the supports 10.

Just after the formation of the second film, which forms the diaphragm 12, an intense internal stress applied in a tensile direction remains in the diaphragm 12. When the diaphragm 12 is contracted due to tensile stress, a force is exerted on the lower surfaces of the third spacers 9. Since the tip ends of the supports 10 project from the joined portions of the second spacer 6 in a cantilever manner, the supports 10 and the third spacers 9 are easily rotated or bent about the joined portions at which the wall of the second spacer 6 (defining the opening 13) joins the supports 10. Suppose that the supports 10, the third spacers 9, and the diaphragm 12 form a single structure. Such a single structure is bent at both of the upper surfaces and lower surfaces of the third spacers 9 elongated in the thickness direction of the diaphragm 12. Herein, forces applied to the lower surfaces of the third spacers 9 due to the internal stress of the diaphragm 12 are exerted in directions crossing dotted lines, which lie from the joined portions, at which the wall of the second spacer 6 (forming the opening 13) joins the supports 10, to the lower surfaces of the third spacer 9. That is, the forces applied to the lower surfaces of the third spacers 9 make the third spacers 9 rotate about the joined portions, at which the wall of the second spacer 6 joins the supports 10, thus bending the supports 10. As shown in FIG. 2A, the internal stress of the diaphragm 12 may be partially released when the third spacers 9 rotate so that the supports 10 are bent. In FIG. 2A, dotted lines show an initial state before the internal stress of the diaphragm 12 is released. When a relatively high internal stress (exerted in a tensile direction) remains in the diaphragm 12, in other words, when a relatively high tensile stress is applied to the diaphragm 12, the diaphragm 12 is difficult to be deflected irrespective of an external force applied thereto. In the present invention, since the condenser microphone 1 has the structure for releasing the internal stress of the diaphragm 12, the diaphragm 12 is easily deflected due to external force applied thereto. That is, the condenser microphone 1 of the present embodiment has a high sensitivity because of the increased amplitude of the diaphragm 12 due to sound pressure.

The present embodiment is characterized in that only the short sides of the diaphragm 12 are fixed but the long sides are maintained free. That is, compared with the foregoing condenser microphone in which the peripheral portion of the diaphragm is entirely fixed in position, the present embodiment offers a higher amplitude in the deflection of the diaphragm 12. In addition, the supports 10 and the diaphragm 12 have different heights measured from the substrate 17. In other words, the supports 10, the third spacers 9, and the diaphragm 12 form a spring structure which is bent at both of the upper surfaces and lower surfaces of the third spacers 9 elongated in the thickness direction of the diaphragm 12. This increases the amplitude of the diaphragm 12 due to sound pressure applied thereto. Incidentally, the present embodiment can be modified in such a way that only the long sides of the diaphragm 12 are fixed in position, alternatively, the diaphragm 12 has a square shape.

As shown in FIG. 1A, the diaphragm 12 and the plate 3 are bridged over the second spacer 6 in mutually crossing directions. Specifically, the diaphragm 12 traverses the opening 13 in a direction parallel to the long sides thereof, while the plate 3 traverses the opening 13 in a direction perpendicular to the long sides of the diaphragm 12. The long sides of the plate 3 are fixed to the second spacer 6 in such a way that the plate joint portions 4 extended from the long sides of the plate 3 join the prescribed portions of the second spacer 6.

The diaphragm 12 and the plate 3 are bridged over the second spacer 6 because of the following reason.

In order to increase the amplitude of the diaphragm 12 due to sound pressure, it is preferable that the diaphragm 12 be fixed and bent along the long sides thereof. When the plate 3 is deflected due to electrostatic attraction occurring between the plate 3 and the diaphragm 12, the displacement of the diaphragm 12 is not substantially changed, but the maximum range of displacement of the diaphragm 12 slightly decreases in response to a reduction of the distance between the plate 3 and the diaphragm 12 so that the maximum range of detection of sound pressure decreases correspondingly. In this point, it is preferable that the short sides of the plate 3 be bridged over the second spacer 6, thus making it difficult for the plate 3 to be deflected. In the diaphragm 12, the center portion causes a relatively high amplitude, while the amplitude becomes smaller towards the fixed portions. That is, the fixed portions of the diaphragm 12 serve as parasitic capacitance. By reducing the length of the plate 3 (or the width of the plate 3), which lies along the long sides of the diaphragm 12 (which are subjected to deflection), it is possible to reduce the parasitic capacitance. In addition, a noise level becomes high as the oppositely overlapping area in plan view between the plate 3 and the diaphragm 12 becomes small. Such a relationship provides an optimum value of an S/N ratio with respect to the width of the plate 3. Depending on the optimum value of the width of the plate 3, the short sides of the plate 3 can be fixed in position, alternatively, the plate 3 has a square shape. Incidentally, numerous holes 5 are formed in the plate 3, and numerous holes 8 are formed in the supports 10.

(c) Operation of Sensing Portion

Sound received by the microphone 1 is transmitted through the holes 5 and 8 so as to propagate into the opening 13. Energy of sound propagating into the opening 13 via the holes 5 and 8 is substantially consumed by causing vibration on the diaphragm 12. That is, a very small percentage of the energy of sound (which propagates into the opening 13 via the holes 5 and 8) is transmitted into the cavity 16 via the external areas of the diaphragm 12 (see arrows in FIG. 2B). Because, the cavity 16 is completely covered with the diaphragm 12 in view of the sound propagation direction, and very small gaps are merely formed between the external areas at which the diaphragm 12 and the substrate 17 partially overlap each other in plan view. Herein, the overlapped areas between the diaphragm 12 and the substrate 17 serve as resistances against sound.

The cavity 16 is sealed in a packaging process; hence, when the diaphragm 12 vibrates, air-pressure vibration occurs inside of the cavity 16. The air-pressure vibration may suppress the vibration of the diaphragm 12. Hence, as the volume of the cavity 16 becomes large, the air-pressure vibration of the cavity 16 is greatly suppressed.

(d) Constitution of Detecting Portion

As shown in FIG. 2B, the diaphragm 12 is connected to a bias voltage source. Specifically, as shown in FIG. 1C, a lead 18, which is formed by the second film having conductivity, connects a pad 2 (which is formed by the second film) to the diaphragm 12. A lead 1105 connected to a terminal 1104 of the bias voltage source is connected to the pad 2. The terminal 1104 of the bias voltage source is also connected to a lead 1106 connected to the substrate 17; hence, both of the diaphragm 12 and the substrate 17 are placed at substantially the same potential. Therefore, no capacity is formed between the diaphragm 12 and the substrate 17.

As shown in FIG. 1A, the short side of the plate 3, which is formed by the fourth film and is not positioned opposite to the diaphragm 12, and the plate joint portion 4 as well as a pad 14 and a lead 7 are positioned opposite to the guard electrode 21, which is formed between the fourth film and the substrate 17. The two guard electrodes 21, which are formed on both ends of the opening 13, are connected together via a lead 23 (see FIGS. 1B and 1C). As shown in FIG. 2B, the guard electrodes 21 and the plate 3 are connected together such that they are placed at substantially the same potential. Specifically, an input terminal of an operational amplifier 1101 (see FIG. 2B), which realizes impedance conversion, is connected to the plate 3 via a lead 1100, the pad 14, the lead 7, and the plate joint portion 4. An output terminal of the operational amplifier 1101 is connected to a pad 11 of the guard electrode 21 via a lead 1102. An amplification factor of the operational amplifier 1101 is set to "1". This places the guard electrodes 21 and the plate 3 at substantially the same potential.

The first spacer 19 having an insulating ability is inserted between the guard electrodes 21 and the substrate 17, thus forming a capacity between the guard electrodes 21 and the substrate 17. This capacity intervenes between the operational amplifier 1101 and the bias voltage source; hence, it does not substantially affect the sensitivity of the condenser microphone 1.

(e) Operation of Detecting Portion

The plate 3 is connected to the operational amplifier 1101 having relatively high internal resistance; hence, even when the electrostatic capacitance formed between the diaphragm 12 and the plate 3 is varied due to the vibration of the diaphragm 12, a very small amount of electric charge existing in the plate 3 moves toward the operational amplifier 1101. That is, it can be presumed that substantially no change occurs in electric charges existing in the plate 3 and the diaphragm 12. Thus, it is possible to extract variations of the electrostatic capacitance formed between the diaphragm 12 and the plate 3 as potential variations of the plate 3.

As described above, the condenser microphone 1 can produce electric signals in response to very small variations of the electrostatic capacitance formed between the diaphragm 12 and the plate 3. According to the condenser microphone 1, variations of sound pressure applied to the diaphragm 12 are converted into variations of electrostatic capacitance, which are then converted into potential variations, based on which electric signals are produced relative to variations of sound pressure.

(f) Manufacturing Method

Next, a manufacturing method of the condenser microphone 1 will be described in detail with reference to FIGS. 3A-3C, FIGS. 4A-4C, FIGS. 5A-5C, and FIGS. 6A-6C, wherein FIGS. 3A, 4A, 5A, and 6A are plan views; FIGS. 3B, 4B, 5B, and 6B are cross-sectional views in a Y-axis direction; and FIGS. 3C, 4C, 5C, and 6C are cross-sectional views in an X-axis direction.

Figure 3A:
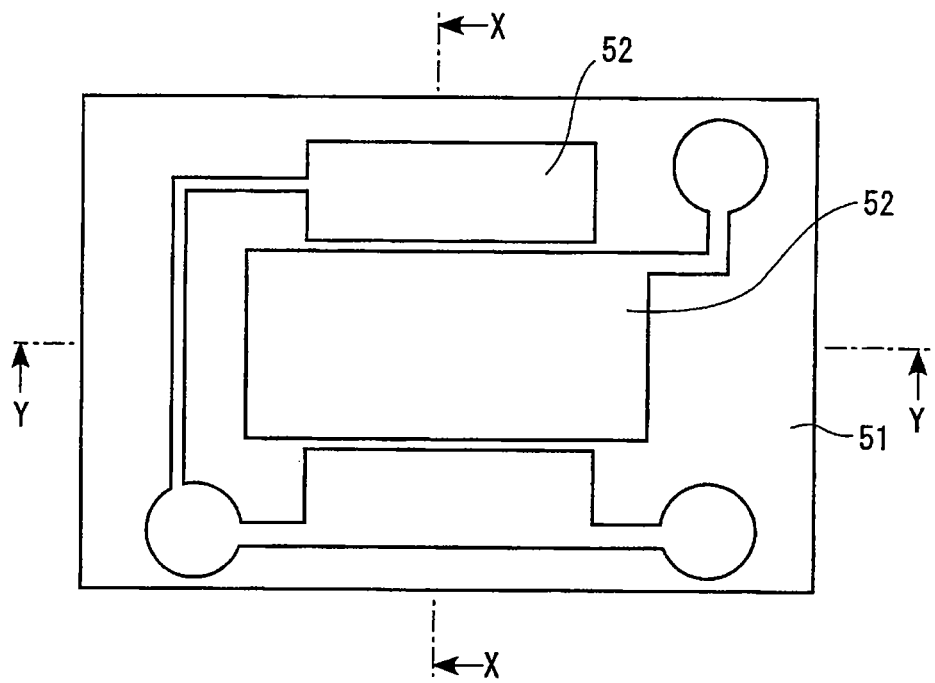
FIG. 3A is a plan view for explaining a first step of a manufacturing method of the condenser microphone.
Figure 3B:
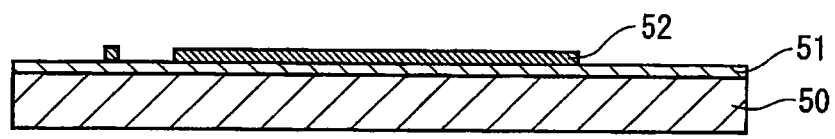
FIG. 3B is a cross-sectional view taken along line Y-Y in FIG. 3A.
Figure 3C:
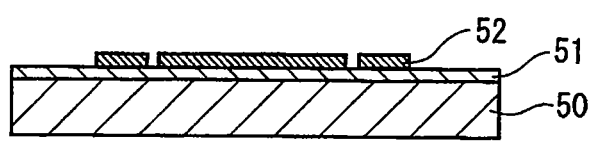
FIG. 3C is a cross-sectional view taken along line X-X in FIG. 3A.

According to a first step of the manufacturing method shown in FIGS. 3A to 3C, a first film 51 having an insulating ability (serving as the first spacer 19) and a second film 52 having conductivity are deposited on the surface of a wafer 50 (serving as the substrate 17); then, the second film 52 is subjected to patterning so as to form the diaphragm 12 and the guard electrodes 21. Specifically, silicon dioxide is deposited on the entire surface of the monocrystal silicon wafer 50 by way of plasma chemical vapor deposition (or plasma CVD), thus forming the first film 51 whose thickness is approximately 2 µm, for example. Next, phosphorus-doped polysilicon is deposited on the first film 51 by way of decompression CVD, thus forming the second film 52 whose thickness is approximately 1 µm. Next, a photoresist film is applied onto the entire surface of the second film 52; then, photolithography (realizing exposure and development using a prescribed resist mask) is performed so as to form a resist pattern. Thereafter, the prescribed part of the second film 52 is selectively removed by way of anisotropic etching such as reactive ion etching (RIE), thus forming the diaphragm 12 and the guard electrodes 21.

Figure 4A:
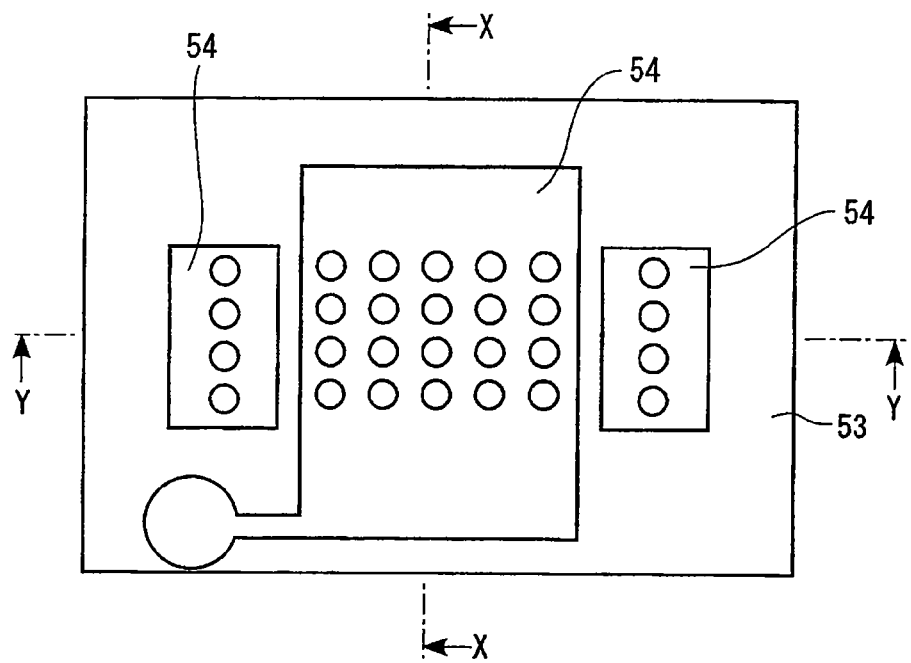
FIG. 4A is a plan view for explaining a second step of the manufacturing method of the condenser microphone.
Figure 4B:
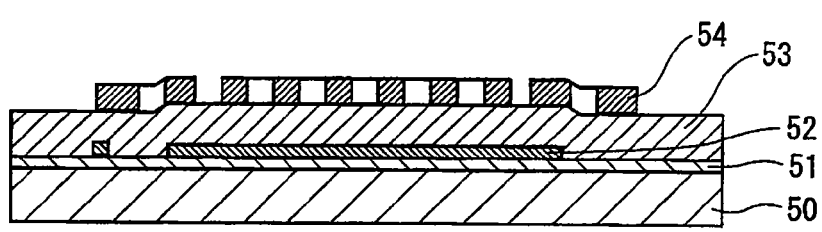
FIG. 4B is a cross-sectional view taken along line Y-Y in FIG. 4A.
Figure 4C:
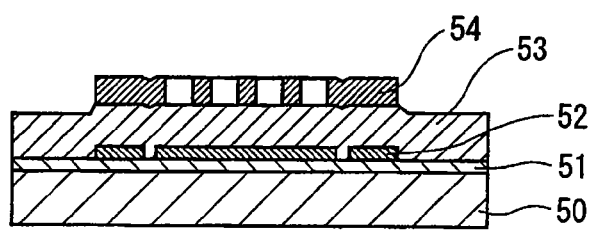
FIG. 4C is a cross-sectional view taken along line X-X in FIG. 4A.

In accordance with a second step of the manufacturing method shown in FIGS. 4A to 4C, a third film 53 having an insulating ability and a fourth film 54 having conductivity are deposited on the second film 52; then, the fourth film 54 is subjected to patterning, thus forming the plate 3 and the supports 10. Specifically, silicon dioxide is deposited on the entire surface of the second film 52 by way of plasma CVD, thus forming the third film 53 whose thickness is approximately 4 µm, for example. Next, phosphorus-doped polysilicon is deposited on the third film 53 by way of decompression CVD, thus forming the fourth film 54 whose thickness is approximately 1 µm. Next, a photoresist film is applied to the entire surface of the fourth film 54; then, photolithography (realizing exposure and development using a prescribed resist mask) is performed so as to form a resist pattern. Thereafter, the prescribed part of the fourth film 54 is selectively removed by way of anisotropic etching such as RIE, thus forming the plate 3 and the supports 10.

Figure 5A:
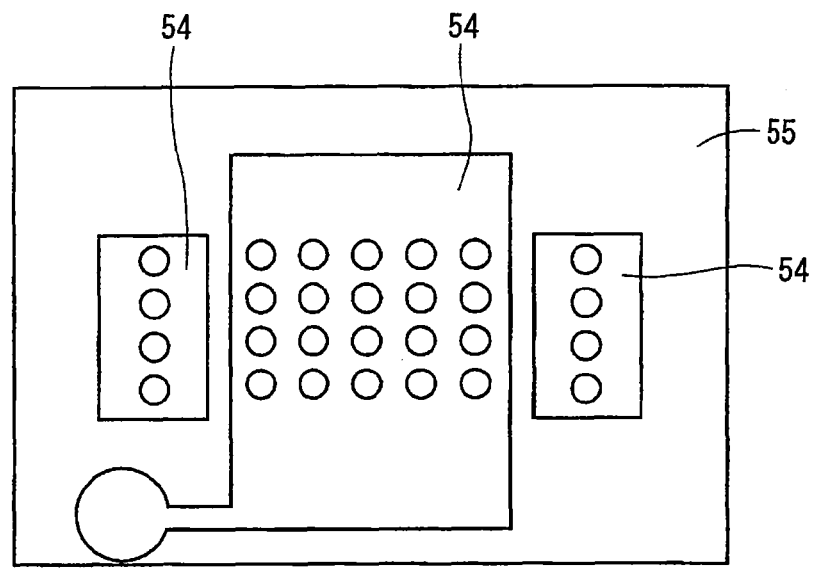
FIG. 5A is a plan view for explaining a third step of the manufacturing method of the condenser microphone.
Figure 5B:
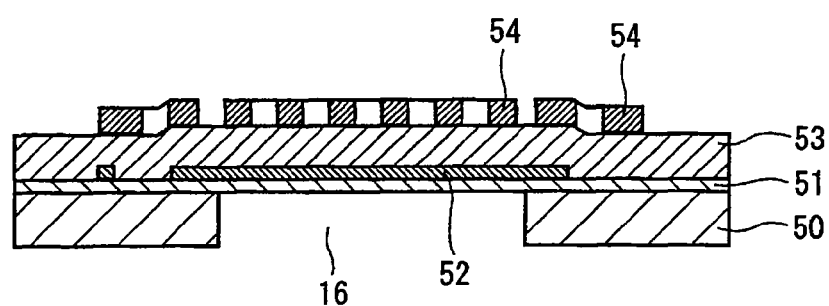
FIG. 5B is a cross-sectional view taken along line Y-Y in FIG. 5A.
Figure 5C:
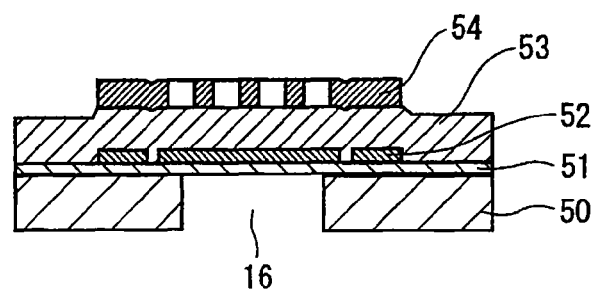
FIG. 5C is a cross-sectional view taken along line X-X in FIG. 5A.

In accordance with a third step of the manufacturing method shown in FIGS. 5A to 5C, the cavity 16 is formed in the wafer 50. Specifically, a photoresist film is entirely applied to the backside of the wafer 50; then, photolithography (realizing exposure and development using a prescribed resist mask) is performed so as to form a resist pattern. Thereafter, the prescribed part of the wafer 50 is selectively removed by way of anisotropic etching such as DEEP-RIE, thus forming the cavity 16.

Figure 6A:
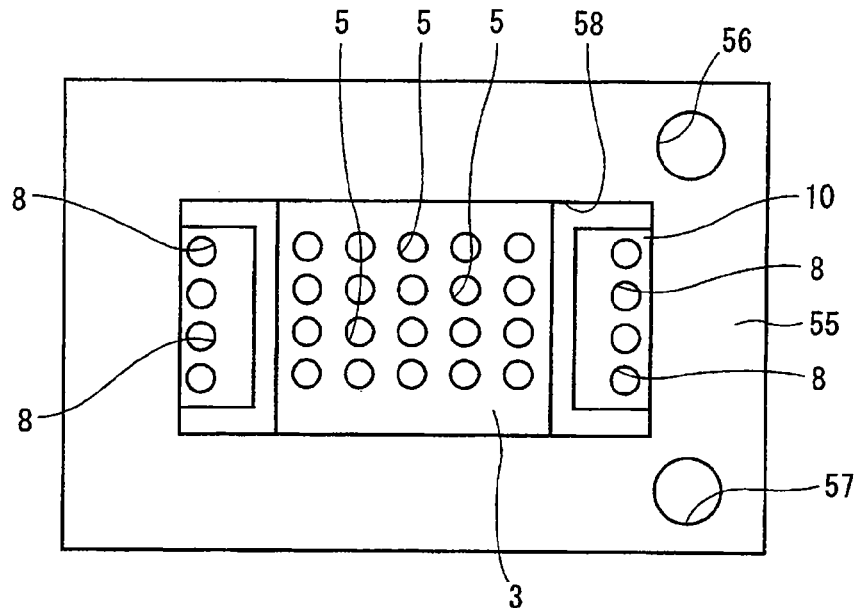
FIG. 6A is a plan view for explaining a fourth step of the manufacturing method of the condenser microphone.
Figure 6B:
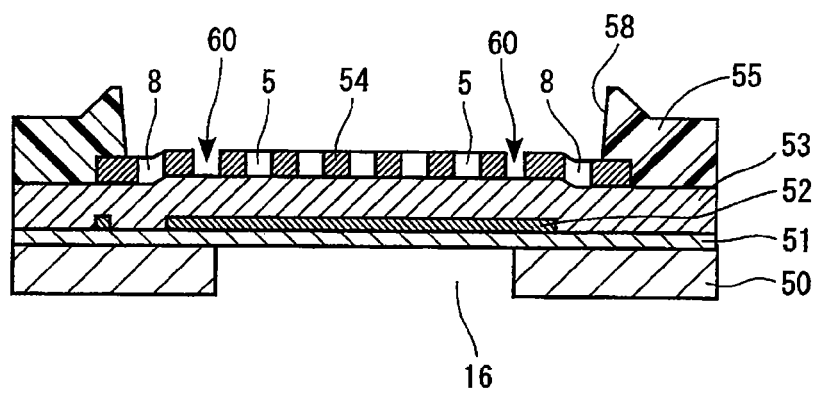
FIG. 6B is a cross-sectional view taken along line Y-Y in FIG. 6A.
Figure 6C:
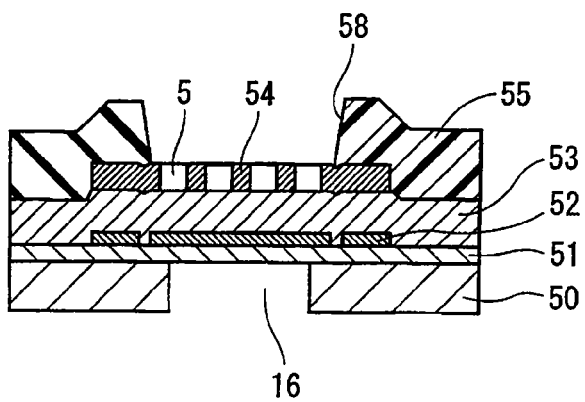
FIG. 6C is a cross-sectional view taken along line X-X in FIG. 6A.

Next, the prescribed parts of the first film 51 and the third film 53 are selectively removed so as to form the first spacer 19, the second spacer 6, and the opening 13. Specifically, a photoresist film is applied to the entire surfaces of the third film 53 and the fourth film 54; then, as shown in FIGS. 6A to 6C, photolithography (realizing exposure and development using a resist mask) is performed so as to form a resist pattern 55. The resist pattern 55 has a through hole 58 corresponding to the opening 13. In the through hole 58 of the resist pattern 55, the plate 3 (which is formed by the fourth film 54) and the projecting portions of the supports 10, which project toward the opening 13 from the second spacer 6, are subjected to exposure. Then, isotropic wet etching using buffered hydrofluoric acid (or Buffered HF) is performed so as to selectively remove the prescribed parts of the first film 51 and the third film 53 (which are silicon oxide films), for example. At this time, the first film 51 and the third film 53 are partially removed in an isotropic manner from the holes 5 and 8 of the fourth film 54 and from gaps 60 of the fourth film 54, which correspond to gaps between the supports 10 and the plate 3. In addition, the first film 51 and the third film 53 are partially removed in an isotropic manner from the cavity 16 formed in the wafer 50. By appropriately designing patterns with regard to the holes 5 and 8 and the gaps 60 of the fourth film 60, it is possible to reliably form the third spacers 9, which are formed by the third film 53 and which remain in the opening 13 as shown in FIGS. 1A to 1C and FIGS. 2A and 2B. Thereafter, dicing and packaging are performed so as to complete the production of the condenser microphone 1.

It is conventionally known that, when bent portions are formed in the structure including a diaphragm and its peripheral portions, all of which vibrate together, the internal stress of the diaphragm is released due to the deformations of the bent portions. According to the conventional method for forming the bent portions in the structure, small irregularities are formed on the surface, on which films of the structure are deposited, in advance, so that the bent portions are formed along small irregularities. In the conventional method, however, photolithography is degraded in accuracy, and the step coverage is degraded as well. This makes it very difficult to control the pattern and film thickness; that is, it is very difficult to form sharply bent portions.

In contrast, the manufacturing method of the present embodiment allows the third spacers 9 having desired shapes to be arbitrarily formed by way of appropriate designing of the resist pattern 55 of the third film 53. For example, it is possible to form the third spacers 9 whose sides vertically extend from the diaphragm 12; alternatively, it is possible to form the third spacers 9 having small widths along the long sides of the diaphragm 12. That is, the present embodiment allows the sharply bent portions to be formed in the structure that vibrates together with the diaphragm 12. For this reason, the present embodiment can remarkably reduce the internal stress of the diaphragm 12 compared with the conventionally known technology. Furthermore, the present embodiment is characterized in that the structure including the supports 10, the third spacers 9, and the diaphragm 12 is integrally formed; hence, it is unnecessary to further introduce another step for forming the diaphragm having a basic structure.

The present embodiment is not necessarily limited to the aforementioned examples and is appropriately modified within the scope of the invention. For example, the diaphragm is not necessarily designed in a rectangular shape; the diaphragm can be modified such that the center portion thereof has a relatively small width compared with the width of the fixed end thereof; alternatively, the center portion thereof has a relatively large width compared with the width of the fixed end thereof.

2. Second Embodiment

Figure 7A:
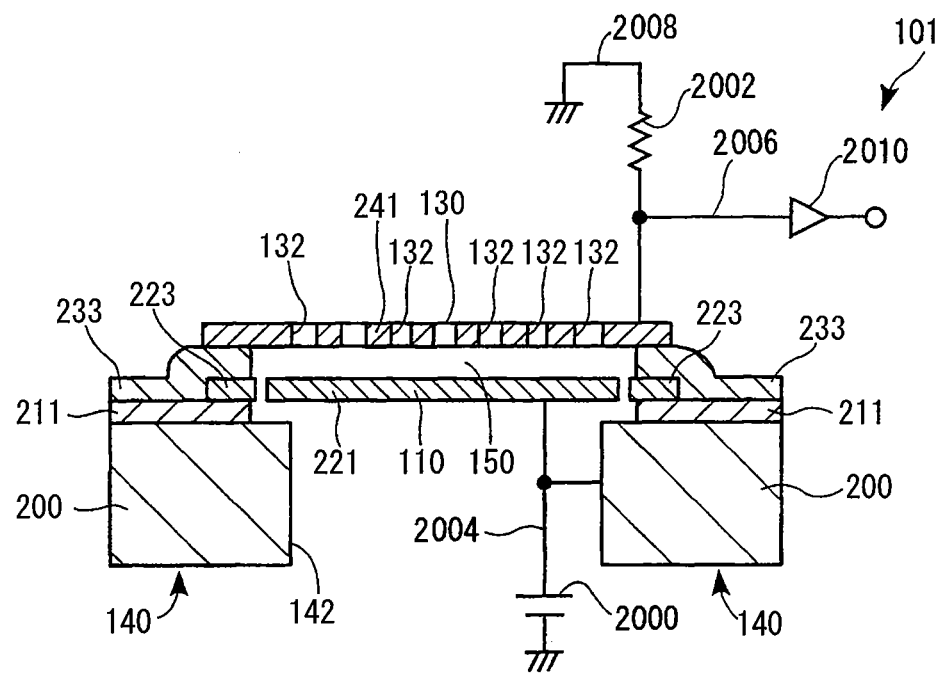
FIG. 7A is a cross-sectional view taken along line B1-B1 in FIG. 8.
Figure 7B:
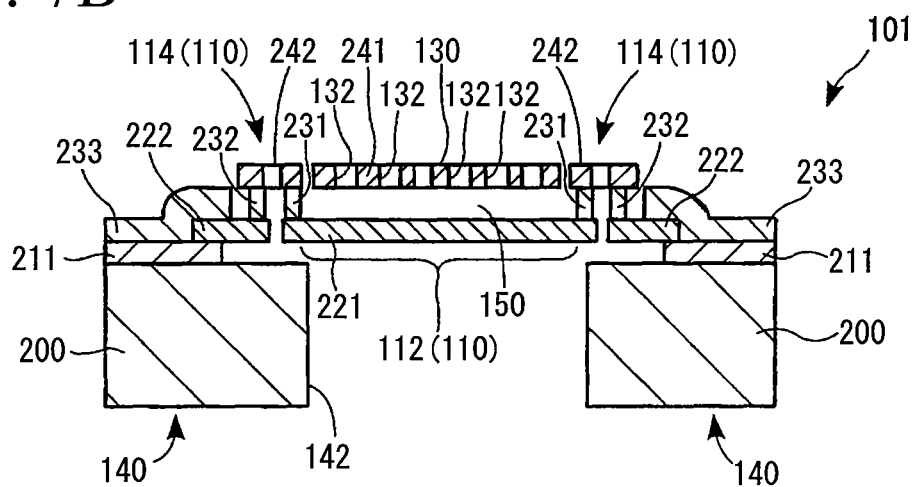
FIG. 7B is a cross-sectional view taken along line A1-A1 in FIG. 8.
Figure 8:
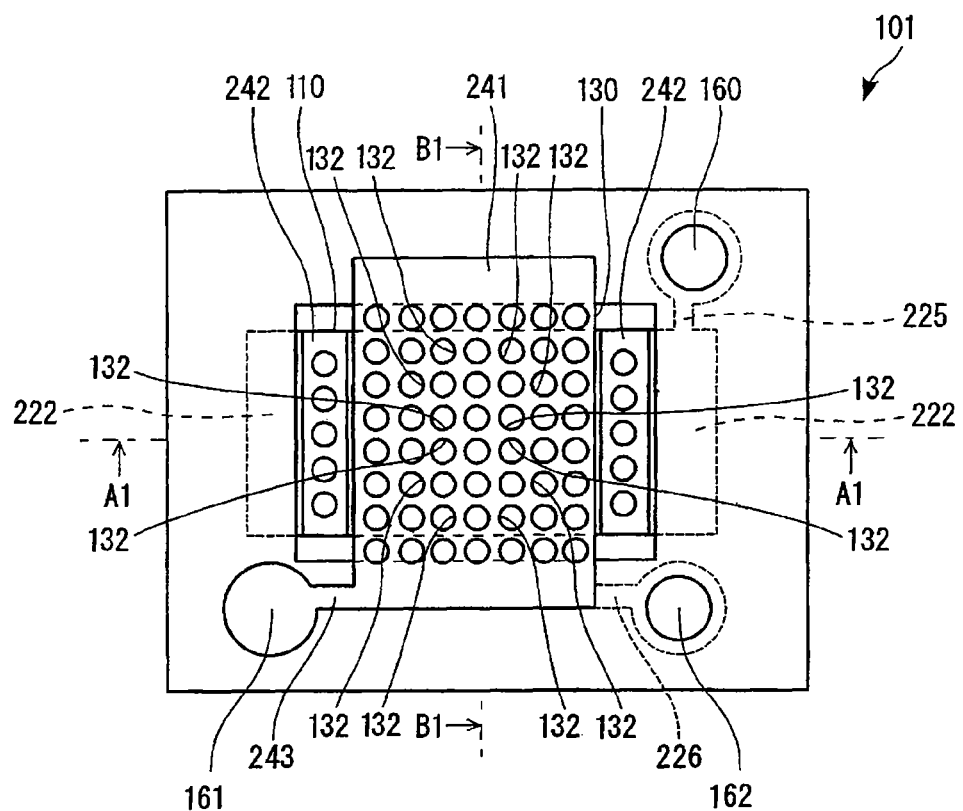
FIG. 8 is a plan view showing a condenser microphone in accordance with a second embodiment of the present invention.

Next, a condenser microphone of a second embodiment of the present invention will be described in detail with reference to FIGS. 7A, 7B, and 8, wherein FIG. 8 is a plan view showing a condenser microphone 101; FIG. 7A is a cross-sectional view taken along line B1-B1 in FIG. 8; and FIG. 7B is a cross-sectional view taken along line A1-A1 in FIG. 8. The condenser microphone 101 is a silicon capacitor microphone, which is manufactured by way of semiconductor manufacturing process. The condenser microphone 101 includes a sensing portion (see FIGS. 7A and 7B) and a detecting portion (see the circuitry shown in FIG. 7A).

(a) Constitution of Sensing Portion

As shown in FIGS. 7A and 7B, the condenser microphone 101 includes a diaphragm 110, a back plate 130, and supports 140.

Both ends of the diaphragm 110 are supported by the supports 140. The diaphragm 110 has a multilayered structure (see FIG. 7B), wherein a center portion 112 of the diaphragm 110 is constituted of the prescribed portion of a conductive film 221 that is not fixed to an insulating film, and wherein a bent portion 114 formed externally of the center portion 112 is constituted of the prescribed portion of the conductive film 221 that is fixed to the insulating film 231, and the prescribed portion of a conductive film 222 that is not fixed to an insulating film 211, as well as the insulating films 231 and 232 and a conductive film 242. The conductive film 221 forming the center portion 112 of the diaphragm 110 functions as a moving electrode. Each of the conductive films 221, 222, and 114 is a semiconductor film composed of polycrystal silicon (or polysilicon), for example. Each of the insulating films 231 and 232 is an oxide film composed of $SiO_2$, for example.

In terminology, the conductive films 221 and 222 each correspond to a first film; the insulating films 231 and 232 each correspond to a second film; and the conductive film 242 corresponds to a third film. Each of the first, second, and third films is not necessarily formed as a single-layered film; hence, it can be formed as a multilayered film. Incidentally, the center portion 112 of the diaphragm 110 can be formed in such a way that a conductive film is formed in the center area of an insulating film so as to serve as a moving electrode. FIG. 7B shows that each of the bent portions 114 is formed by use of the step portion formed by the insulating film 231 and the step portion formed by the insulating film 232; but this is not a restriction. That is, each of the bent portions 114 has at least one step portion; and the insulating film is not necessarily shaped in correspondence with the conductive film.

The back plate 130 (or plate 130) is constituted of the prescribed portion of a conductive film 241 that is not fixed to an insulating film 233 (see FIG. 7A), whereas both ends of the back plate 130 are fixed to the insulating film 233. The conductive film 241 is a semiconductor film composed of polysilicon, for example. Both ends of the conductive film 241 are supported by the supports 140 so that the conductive film 241 crosses the center portion 112 of the diaphragm 110 three-dimensionally. As described above, the back plate 130 is positioned opposite to only the center portion 112 of the diaphragm 110, which is greatly displaced due to sound waves applied thereto, thus reducing the capacity (hereinafter, referred to as a microphone capacity), which is formed between the diaphragm 110 and the back plate 130 and which is not substantially changed due to sound waves applied thereto. As shown in FIG. 7, a plurality of holes 132 are formed in the back plate 130. Sound waves originated from a sound source (not shown) are transmitted to the diaphragm 110 via the holes 132. The back plate 130 having conductivity serves as a fixed electrode.

The supports 140 are partially attached to the insulating film 233 of the conductive film 241 and are partially attached to the insulating films 211 and 233 of the conductive film 222, wherein they include the insulating film 233, the conductive film 223, and the insulating film 211 as well as a substrate 200. Each of the insulating films 211 and 233 is an oxide film composed of $SiO_2$; the conductive film 223 is a semiconductor film composed of polysilicon; and the substrate 200 is a monocrystal silicon substrate, for example. An opening 142 is formed to run through the substrate 200 and the insulating film 211 so that it is defined by the supports 140. The opening 142 forms a back cavity of the condenser microphone 101.

Figure 10A:
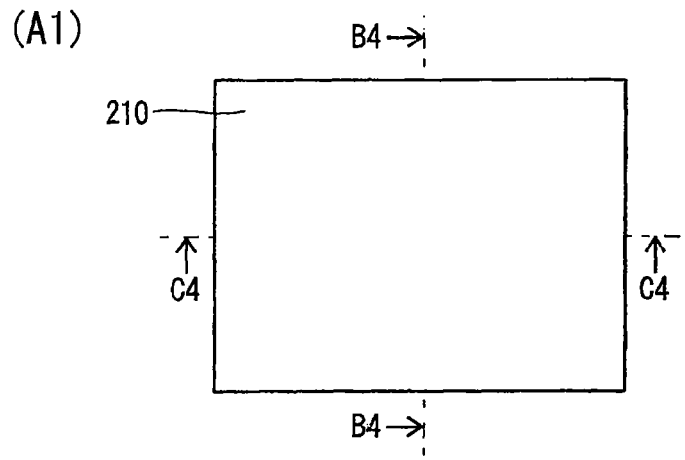
FIG. 10A is a plan view for explaining a first step of a manufacturing method of the condenser microphone.
Figure 10B:
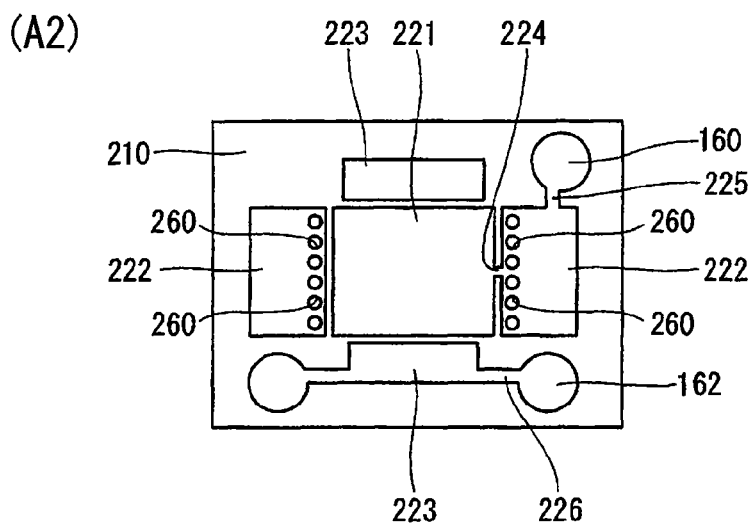
FIG. 10B is a plan view for explaining a second step of the manufacturing method of the condenser microphone.

In FIG. 8, an electrode 160 connects the diaphragm 110 and the detecting portion together. The electrode 160 is formed in the same layer as the conductive film 222. As shown in FIG. 10B, the electrode 160 is connected to the conductive film 221 via a lead 225, which lies between the electrode 160 and the conductive film 222, and a lead 224, which lies between the conducive films 222 and 221. An electrode 161 connects together the back plate 130 and the detecting portion. The electrode 161 is connected to the conductive film 241 via a lead 243, which lies between the electrode 161 and the conductive film 241.

As shown in FIG. 10B, an electrode 162 is connected to the conductive film 223 via a lead 226, which lies between the electrode 162 and the conductive film 223. The conductive film 223 is electrically insulated from other conductive films and is formed between the substrate 100 and the conductive film 241 forming the back plate 130. By applying the voltage, which is identical to the output voltage of the detecting portion, to the electrode 162, it is possible to use the conductive film 223 as a guard electrode. Details will be described later.

The condenser microphone 101 can be redesigned such that the diaphragm 110 is positioned close to the sound source rather than the back plate 130 so that sound waves are directly transmitted to the diaphragm 110. In this case, the holes 132 of the back plate 130 serve as passages by which an air gap 150 formed between the diaphragm 110 and the back plate 130 communicates the back cavity.

(b) Constitution of Detecting Portion

As shown in FIG. 7A, the diaphragm 110 is connected to a bias voltage circuit 2000; and the back plate 130 is connected to a pre-amplifier 2010 and is also grounded via a resistor 2002. Based on the voltage applied between the diaphragm 110 and the ground, the detecting portion of the condenser microphone 101 produces electric signals by way of the pre-amplifier 2010.

Specifically, a lead 2004, which is also connected to the bias voltage circuit 2000, is connected between the electrode 160 and the substrate 200. A lead 1006, which is connected to one end of the resistor 2002, is connected to the electrode 161. A lead 2008, which is connected to the other end of the resistor 2002, is connected to the ground (i.e., a packaging board of the condenser microphone 101). The resistor 2002 has a relatively high resistance; specifically, it is preferable that the resistor 2002 have giga-order ohm. The lead 2006, which connects the back plate 130 and the resistor 2002 together, is connected to the input terminal of the pre-amplifier 2010 as well. It is preferable that the pre-amplifier 2010 have high input impedance.

As described above, the voltage, which is identical to the output voltage of the detecting portion, is applied to the electrode 162, so that the conductive film 223 serves as the guard electrode. The guard electrode reduces the parasitic capacitance occurring between the substrate 200 and the conductive film 241 forming the back plate 130. In order to use the conductive film 223 as the guard electrode, the pre-amplifier 2010 (see FIG. 7A) serves as a voltage-follower circuit and the output terminal thereof is connected to the electrode 162. By placing both of the conductive film 241 (forming the back plate 130) and the conductive film 223 at the same potential, it is possible to eliminate parasitic capacitance between the conductive films 241 and 223; hence, it is possible to reduce parasitic capacitance between the conductive film 241 and the substrate 200.

(c) Operation of Condenser Microphone

When sound waves are transmitted to the diaphragm 110 via the holes 132 of the back plate 130, the diaphragm 110 vibrates due to sound waves applied thereto. The vibration of the diaphragm 110 causes variations of the distance between the diaphragm 110 and the back plate 130, thus varying the electrostatic capacitance (or capacity) between the diaphragm 110 and the back plate 130.

Since the back plate 130 is connected to the resistor 2002 having a relatively high resistance, electric charges accumulated in the microphone capacity do not substantially flow through the resistor 2002 irrespective of variations of the electrostatic capacitance, which may be caused by the vibration of the diaphragm 110. That is, it is presumed that electric charges accumulated in the microphone capacity do not substantially change. Thus, it is possible to translate variations of electrostatic capacitance into variations of the voltage between the back plate 130 and the ground.

As described above, the condenser microphone 101 can produce electric signals in response to very small variations of electrostatic capacitance. That is, the condenser microphone 101 converts variations of sound pressure applied to the diaphragm 110 into variations of electrostatic capacitance, which are then converted into variations of voltage, based on which electric signals are produced in response to variations of sound pressure.

When the bent portions 114 are deformed due to residual stress of the center portion 112 of the diaphragm 110, the residual stress of the center portion 112 is released. When a relatively large deformation occurs on the bent portions 114 due to sound waves, it is possible to increase the amplitude of vibration of the center portion 112 due to sound waves applied to the diaphragm 110.

When the diaphragm 110 vibrates due to sound waves, the stress is caused by the deformation of the diaphragm 110 and is concentrated at the bent portions 114. For this reason, when the bent portions 114 are reduced in strength, there is a possibility that the diaphragm 110 may be destroyed at the bent portions 114.

Figure 9:
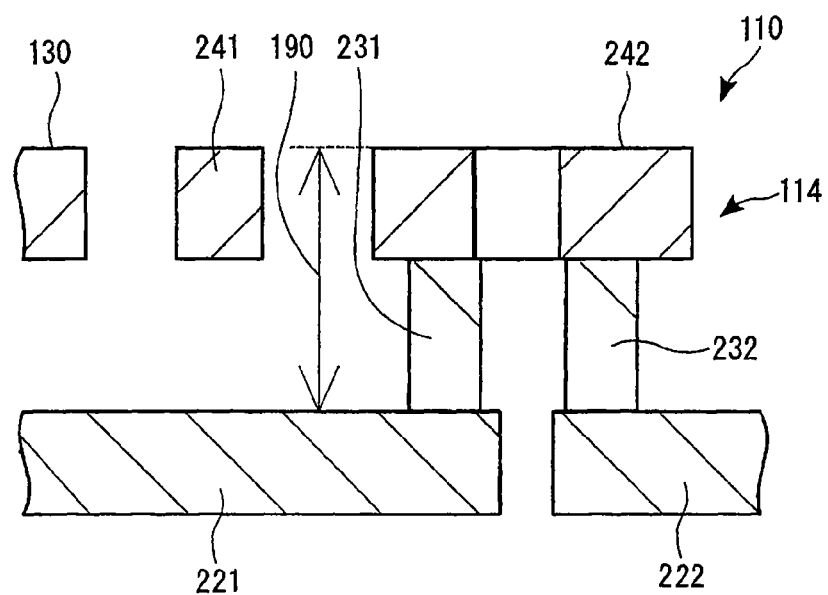
FIG. 9 is an enlarged cross-sectional view diagrammatically showing the structure regarding a bent portion of a diaphragm included in the condenser microphone.

In order to cope with the aforementioned drawback, the bent portions 114 of the diaphragm 110 are each formed in the multilayered structure composed of thin films. This makes it possible to form the bent portions 114 in the periphery of the center portion 112 of the diaphragm 110 without causing unwanted bends of thin films forming the bent portions 114. This prevents the bent portions 114 of the diaphragm 110 from being reduced in density. The step difference of the bent portion 114 (see an arrow 190 in FIG. 9) can be controlled by controlling the thickness of the second film (i.e., the insulating films 131 and 132). Due to the multilayered structure of the bent portion 114 of the diaphragm 110, it is possible to reliably form the bent portion 114 having a desired step difference while securing the satisfactory strength of the diaphragm 110.

(d) Manufacturing Method of Condenser Microphone

Next, a manufacturing method of the condenser microphone 101 will be described in detail with reference to FIGS. 10A to 10G, FIGS. 11A to 11G, and FIGS. 12A to 12G, wherein seven steps are denoted by reference symbols (A1) to (A7), (B1) to (B7), and (C1) to (C7), and wherein reference symbols (B1) to (B7) designate cross-sectional views taken along line B4-B4 in FIG. 10A, and reference symbols (C1) to (C7) designate cross-sectional views taken along line C4-C4 in FIG. 10A.

Figure 12A:
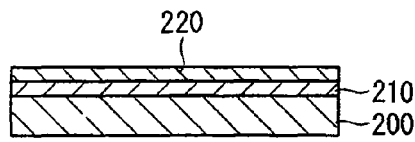
FIG. 12A is a cross-sectional view taken along line C4-C4 in FIG. 10A, which is used for explaining the first step of the manufacturing method of the condenser microphone.
Figure 12B:
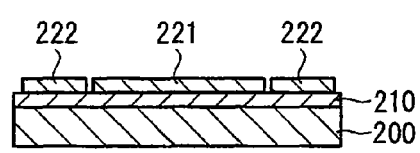
FIG. 12B is a cross-sectional view for explaining the second step of the manufacturing method of the condenser microphone.
Figure 12C:
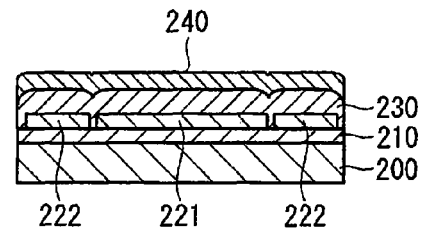
FIG. 12C is a cross-sectional view for explaining the third step of the manufacturing method of the condenser microphone.
Figure 12D:
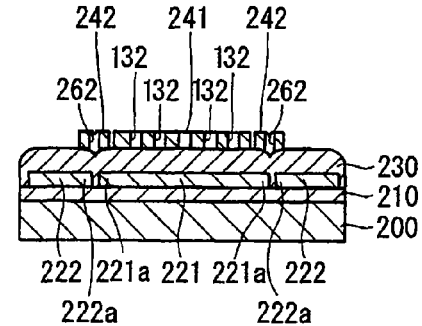
FIG. 12D is a cross-sectional view for explaining the fourth step of the manufacturing method of the condenser microphone.
Figure 12E:
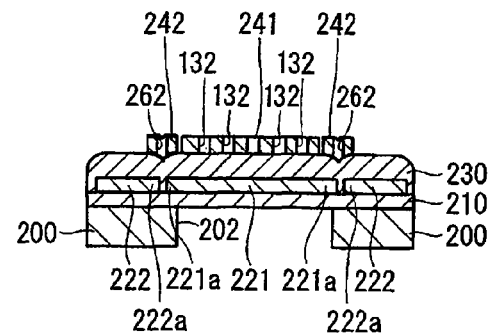
FIG. 12E is a cross-sectional view for explaining the fifth step of the manufacturing method of the condenser microphone.

In a first step (see (C1), i.e., FIG. 12A), an insulating film 210 is formed on a substrate 200, which is a semiconductor substrate such as a monocrystal silicon substrate, for example. Specifically, an insulating material is deposited on the surface of the substrate 200 by way of chemical vapor deposition (CVD) so as to form the insulating film 210 on the substrate 200.

Next, a conductive film 220 is formed on the insulating film 210 by way of CVD. The conductive film 220 is a polysilicon film, for example. This process can be omitted by using an SOI (Silicon On Insulator) substrate.

In a second step (see (A2), i.e., FIG. 10B), the conductive film 220 is subjected to patterning so as to form conductive films 221 to 223, leads 224, and electrodes 160 and 162. Each of the conductive films 221 and 222 has a rectangular shape, wherein the conductive film 221 forming the center portion 112 of the diaphragm 110 is positioned in the longitudinal direction of the diaphragm 110 and is positioned between the two conductive films 222 forming the bent portions 114. The conductive film 223 is formed to match a conductive film 241 (formed in another step, which will be described later) in terms of the shape and position.

Specifically, the patterning of the conductive film 220 is performed as follows:

First, a resist film, by which the unwanted portion of the conductive film 220 is exposed, is formed on the conductive film 220 by way of lithography. That is, a resist is applied to the conductive film 220 so as to form the resist film. Then, a mask having a prescribed shape is arranged so that the resist film is subjected to exposure and development, thus removing the unwanted portion of the resist film. This reliably forms the resist film, by which the unwanted portion of the conductive film 220 is exposed, on the conductive film 220. Next, the exposed portion of the conductive film 220, which is exposed from the resist film, is subjected to etching, i.e., reactive ion etching (RIE), thus forming the conductive films 221 to 223, the leads 224 and 225, and the electrodes 160 and 162. Thereafter, the resist film is completely removed by use of a resist peeling solution composed of N-methyl-2-pyrrolidone (NMP).

Figure 10C:
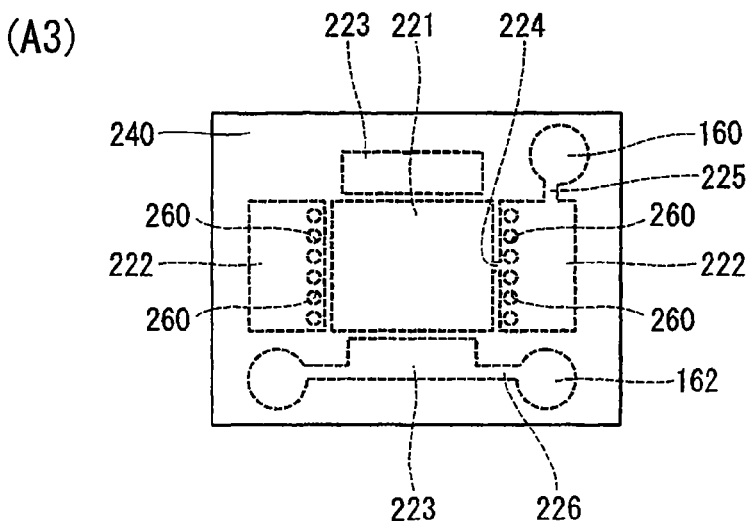
FIG. 10C is a plan view for explaining a third step of the manufacturing method of the condenser microphone.
Figure 10D:
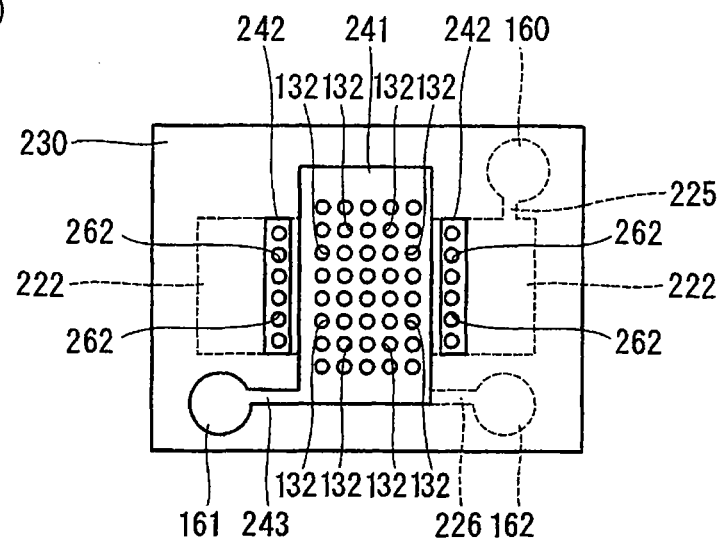
FIG. 10D is a plan view for explaining a fourth step of the manufacturing method of the condenser microphone.

In a third step (see (A3), i.e., FIG. 10C), an insulating film 230 whose thickness is larger than the thickness of the conductive film 220 is formed on the insulating film 210 by way of CVD. In order to realize the following step in which the insulating films 210 and 230 are selectively removed from the conductive films 221 to 223 and conductive films 241 and 242 (see FIG. 8), the insulating films are formed using the prescribed material whose selection ratio is higher than the selection ratio of the material of the conductive films. For example, when the conductive films are composed of polysilicon, the insulating films are composed of $SiO_2$. In order to retain the insulating films (forming the condenser microphone 101) by partially removing the insulating films in the step for selectively removing the insulating films from the conductive films, it is preferable that both of the insulating films 210 and 230 be composed of the same material. When the insulating films 210 and 230 are composed of the same material, the same etching rate can be set to them. This provides an easy way for controlling the amount of etching with respect to the insulating films.

Next, a conductive film 240 is formed on the insulating film 230 by way of CVD. The conductive film 240 is a polysilicon film, for example.

Figure 11A:
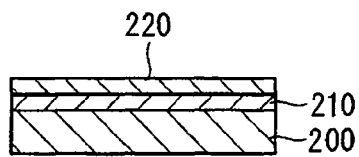
FIG. 11A is a cross-sectional view taken along line B4-B4 in FIG. 10A, which is used for explaining the first step of the manufacturing method of the condenser microphone.
Figure 11B:
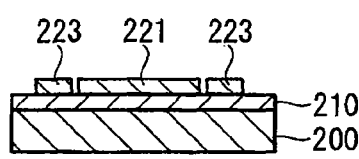
FIG. 11B is a cross-sectional view for explaining the second step of the manufacturing method of the condenser microphone.
Figure 11C:
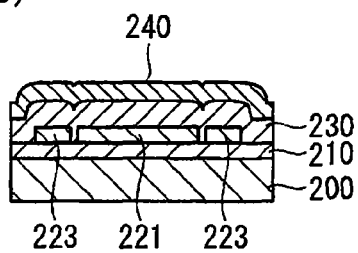
FIG. 11C is a cross-sectional view for explaining the third step of the manufacturing method of the condenser microphone.
Figure 11D:
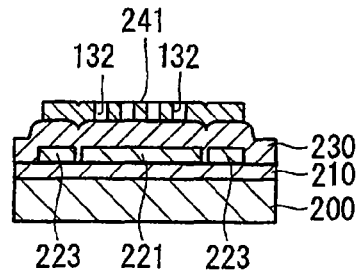
FIG. 11D is a cross-sectional view for explaining the fourth step of the manufacturing method of the condenser microphone.
Figure 11E:
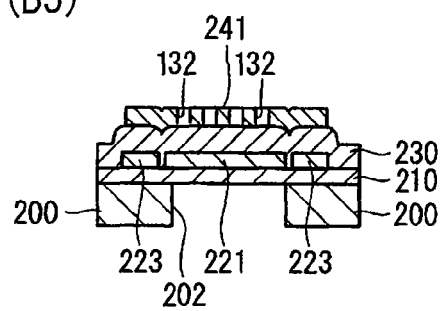
FIG. 11E is a cross-sectional view for explaining the fifth step of the manufacturing method of the condenser microphone.

In a fourth step (see (B4), i.e., FIG. 11D), the conductive film 240 is subjected to patterning so as to form the conductive film 241 forming the back plate 130 and the conductive films 242 forming the bent portions 114 of the diaphragm 110 as well as the electrode 161 and the lead 243. The conductive film 241 has a rectangular shape, the longitudinal direction of which crosses at a right angle with the alignment direction of the conductive films 221 and 222 and also three-dimensionally crosses the conductive film 221 via the insulating film 230. Each of the conductive films 242 has a rectangular shape, wherein they extend from near-end portions 221a of the conductive film 221, which are positioned adjacent to the conductive films 222, to near-end portions 222a of the conductive films 222, which are positioned adjacent to the conductive film 221.

Figure 10E:
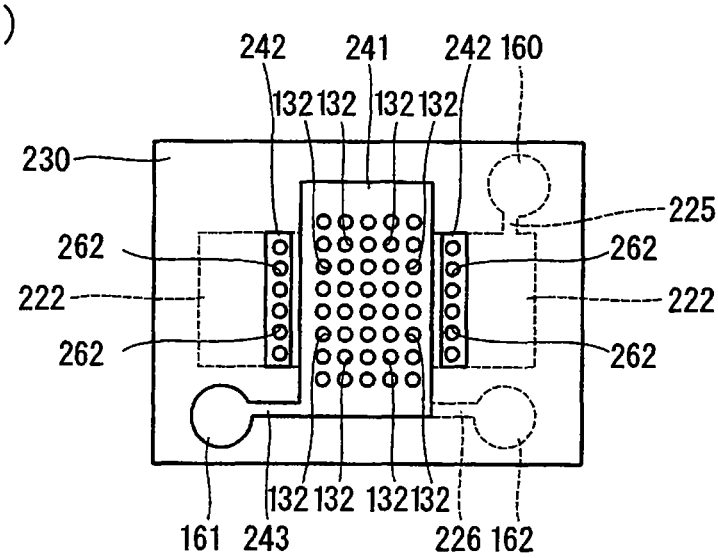
FIG. 10E is a plan view for explaining a fifth step of the manufacturing method of the condenser microphone.

In a fifth step (see (A5), i.e., FIG. 10E), an opening 202 corresponding to the opening 142 defined by the supports 140 is formed in the substrate 200, as follows:

First, a resist film for exposing a prescribed portion of the substrate 200, which is used to form the opening 202, is formed by way of lithography. Next, the exposed portion of the substrate 200, which is exposed from the resist film, is removed by way of Deep RIE, which is performed deeply toward the insulating film 210, thus forming the opening 202 of the substrate 200. Thereafter, the resist film is removed.

Figure 10F:
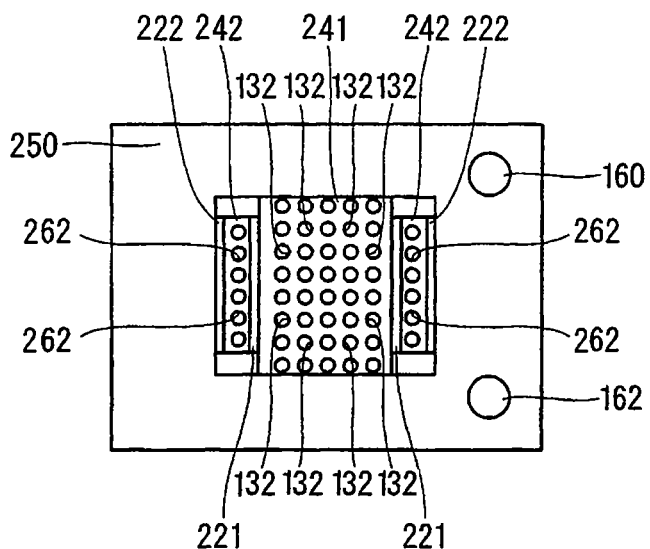
FIG. 10F is a plan view for explaining a sixth step of the manufacturing method of the condenser microphone.
Figure 10G:
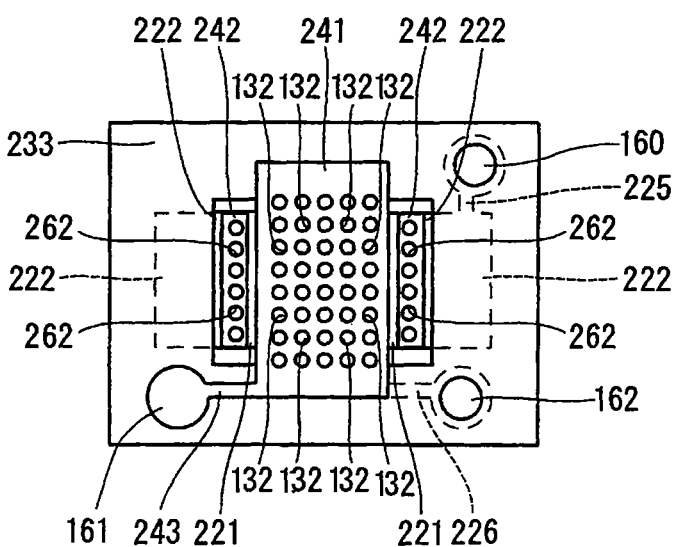
FIG. 10G is a plan view for explaining a seventh step of the manufacturing method of the condenser microphone.
Figure 11F:
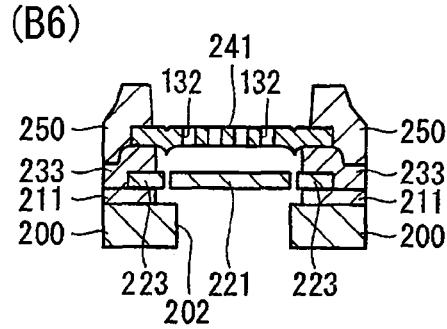
FIG. 11F is a cross-sectional view for explaining the sixth step of the manufacturing method of the condenser microphone.
Figure 11G:
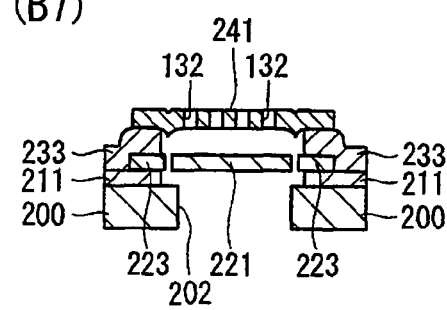
FIG. 11G is a cross-sectional view for explaining the seventh step of the manufacturing method of the condenser microphone.
Figure 12F:
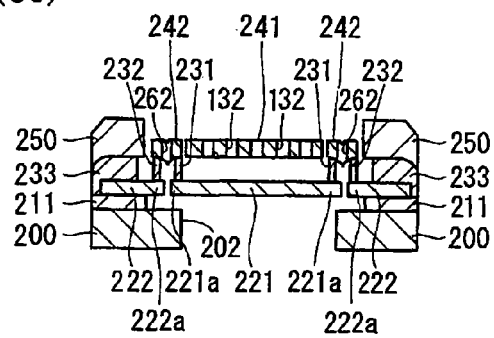
FIG. 12F is a cross-sectional view for explaining the sixth step of the manufacturing method of the condenser microphone.
Figure 12G:
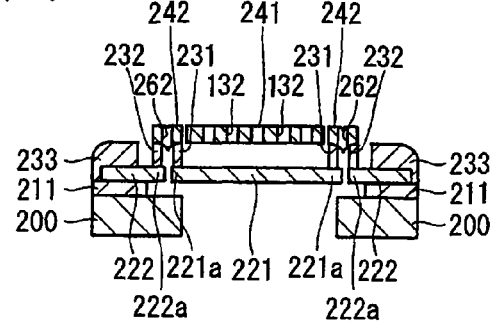
FIG. 12G is a cross-sectional view for explaining the seventh step of the manufacturing method of the condenser microphone.

Next, the insulating films 210 and 230 are partially removed so as to form various portions of the condenser microphone 101 (see (7) and (C7), i.e., FIG. 11G and FIG. 12G). Specifically, the insulating film 230 is partially removed as follows:

First, in a sixth step (see (A6), (B6), and (C6), i.e., FIG. 10F, FIG. 11F, and FIG. 12F), a resist film 250 for covering prescribed portions, which remain as the supports 140, is formed on the insulating film 230. Next, the insulating film 230 is removed by way of wet etching. When the insulating films 210 and 230 are composed of $SiO_2$, for example, it is possible to use hydrofluoric acid as an etching solution.

The etching solution is infiltrated into the holes 132, holes 244 of the conductive films 242, air gaps formed between the conductive films 241 and 242 and the resist film 250, and the opening 202 of the substrate 200, thus dissolving the insulating films 210 and 230. For example, when the etching solution dissolves the insulating film 230 existing between the conductive films 221 and 241 so as to form an air gap 150 (see FIGS. 7A and 7B) between the diaphragm 110 and the back plate 130, prescribed portions of the insulating film 230, which are covered with he resist film 250 and the substrate 200, still remain so as to form the supports 140.

At this time, the etching solution is infiltrated into the gaps existing between the conducive film 221 and the conductive films 222 as well as the holes 244 of the conductive films 242 so as to dissolve the insulating film 230, wherein the prescribed portions of the insulating film 230 existing between the conductive film 221 and the conductive films 242 and the other portions of the insulating film 230 existing between the conductive films 242 and the conductive films 222 still remain so as to form the second film, i.e., the insulating films 231 and 232. By partially removing the insulating film 230, it is possible to form various portions of the condenser microphone 101, thus forming the sensing portion.

The second embodiment can be further modified in a variety of ways; hence, a variation of the second embodiment will be described in detail. Herein, a condenser microphone 102 according to the variation of the second embodiment (see FIGS. 13A and 13B) is basically identical to the condenser microphone 101 in terms of the detecting portion; hence, the following description is made with respect to the sensing portion and the manufacturing method of the condenser microphone 102.

(e) Constitution of Sensing Portion

Figure 13A:
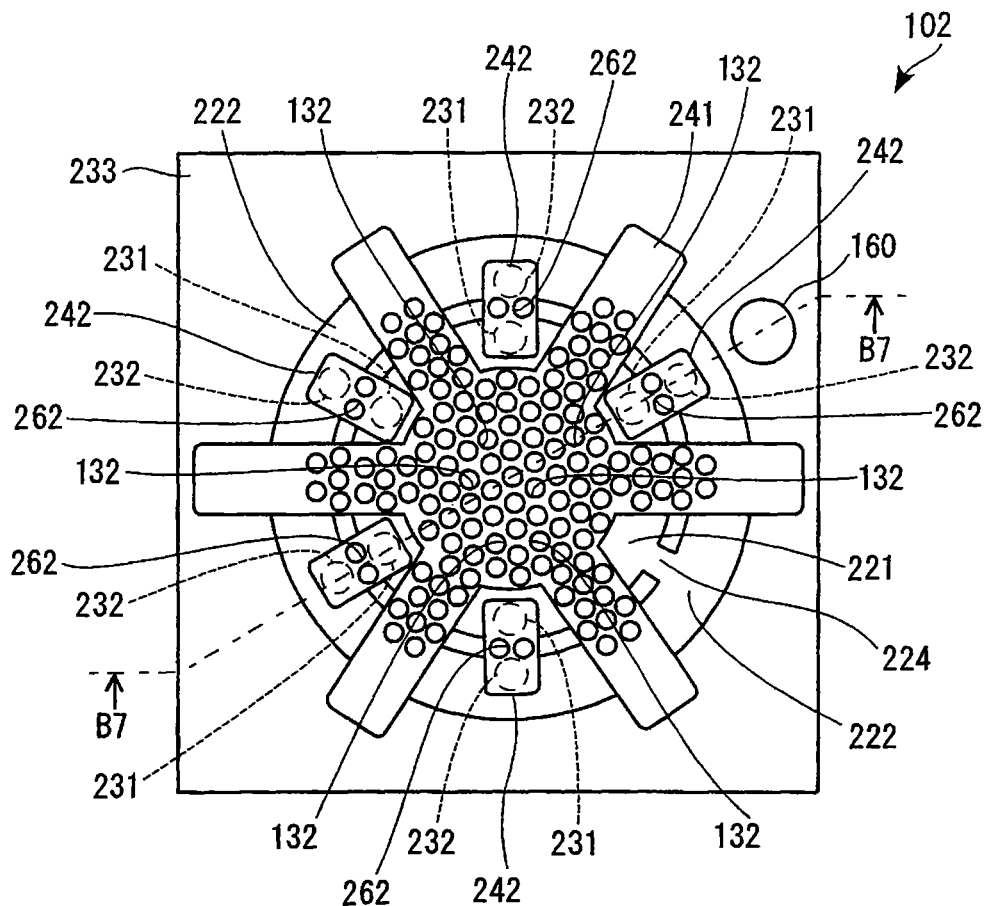
FIG. 13A is a plan view showing a condenser microphone in accordance with a variation of the second embodiment of the present invention.
Figure 13B:
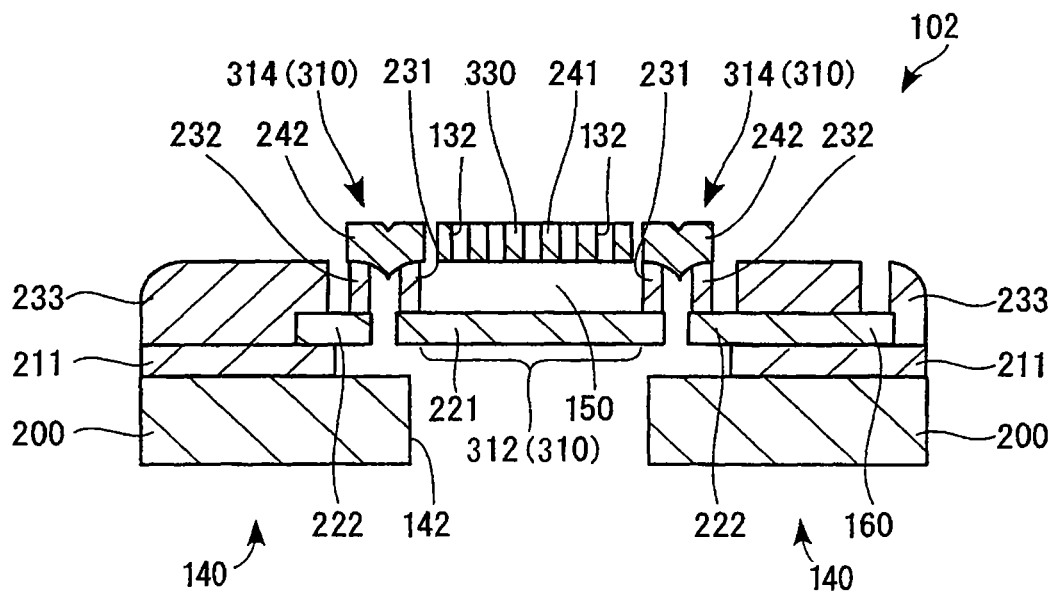
FIG. 13B is a cross-sectional view taken along line B7-B7 in FIG. 13A.

FIGS. 13A and 13B show the constitution of the sensing portion of the condenser microphone 102 in accordance with the variation of the second embodiment of the present invention. FIG. 13A is a plan view, and FIG. 13B is a cross-sectional view taken along line B7-B7 in FIG. 13A, wherein parts identical to those of the condenser microphone 101 are designated by the same reference numerals; hence, the detailed descriptions thereof are omitted as necessary. The sensing portion of the condenser microphone 102 includes a diaphragm 310 and a back plate 330, which differ from the diaphragm 110 and the back plate 130 of the condenser microphone 101.

The diaphragm 310 has a center portion 312 and a plurality of bent portions 314, which extend outwardly of the center portion 312 and which are supported by the supports 140. The center portion 312 of the diaphragm 310 has a disk-like shape, and the bent portions 314 are extended in radial directions of the center portion 312 toward the supports 140.

Similar to the bent portions 114 included in the condenser microphone 101, the bent portions 314 are partially attached to the conductive film 221 and the insulating film 231 and are partially not attached to the conductive film 222 and the insulating film 211, wherein they are each configured in a multilayered structure including the insulating films 231 and 232 and the conductive film 242. Specifically, the conductive film 221 has a disk-like shape; the conductive film 222 has a ring shape surrounding the conductive film 221; and the insulating films 231 and 232 have columnar shapes. Specifically, the insulating films 231 are positioned on the near-end portions of the conductive film 221; and the insulating films 232 are positioned on the inner near-end portions of the conductive films 222.

The back plate 330 differs from the back plate 130 in two-dimensional shape. That is, the center portion of the back plate 330 has a disk-like shape, and the near-end portions thereof extend in a radial direction toward the supports 140. The film configuration of the back plate 330 is substantially identical to that of the back plate 130.

(f) Manufacturing Method of Condenser Microphone

Next, the manufacturing method of the condenser microphone 102 will be described in detail with reference to FIGS. 14A to 14F, FIGS. 15A to 15F, and FIGS. 16A to 16F, wherein six steps are denoted by reference symbols (A1) to (A6), (B1) to (B6), and (C1) to (C6), and wherein reference symbols (B1) to (B6) designate cross-sectional views taken along line B8-B8 in FIG. 14A, and reference symbols (C1) to (C6) designate cross-sectional views taken along line C8-C8 in FIG. 14A.

In a first step (see (C1), i.e., FIG. 16A), similar to the manufacturing method of the condenser microphone 101, the insulating film 210 is formed on the substrate 200, then, the conductive film 220 is formed on the insulating film 210.

In a second step (see (A2), i.e., FIG. 14B, the conductive film 220 is subjected to patterning so as to form the conductive films 221 and 222, the leads 224 and 225, and the electrode 160. The conductive film 221 has a disk-like shape; the conductive film 222 has a ring shape surrounding the conductive film 221; the lead 224 extends from the conductive film 221 to the conductive film 222; and the lead 225 extends from the conductive film 222 to the electrode 160.

In a third step (see (C3), i.e., FIG. 16C), similar to the manufacturing method of the condenser microphone 101, the insulating film 230 is formed on the insulating film 210 and the conductive film 220, then, a conductive film 240 is formed on the insulating film 230.

In a fourth step (see (A4), i.e., FIG. 14D), the conductive film 240 is subjected to patterning so as to form the conductive film 241 forming the back plate 330 and a plurality of conductive films 242 forming the bent portions 314 of the diaphragm 310. The center portion of the conductive film 241 has a disk-like shape having near-end portions, which are extended from the center portion in a radial manner. The conductive films 242 extend from near-end portions 221a of the conductive film 221 to inner near-end portions 222a of the conductive films 222.

Figure 14E:
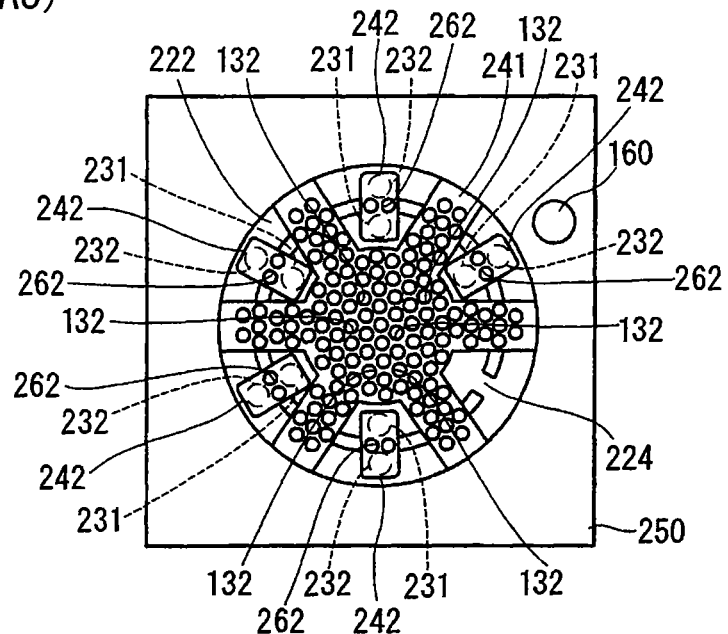
FIG. 14E is a plan view for explaining a fifth step of the manufacturing method of the condenser microphone.
Figure 14F:
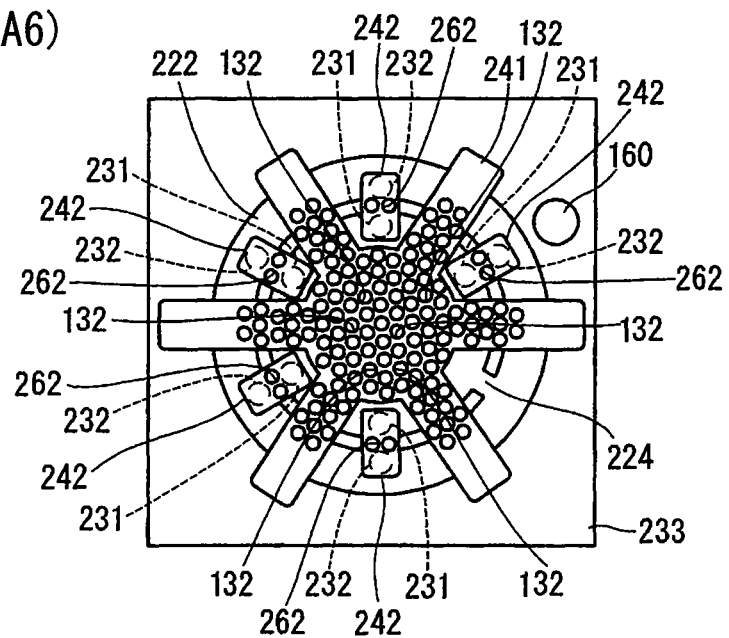
FIG. 14F is a plan view for explaining a sixth step of the manufacturing method of the condenser microphone.
Figure 15A:
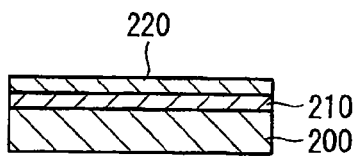
FIG. 15A is a cross-sectional view taken along line B8-B8 in FIG. 14A, which is used for explaining the first step of the manufacturing method of the condenser microphone.
Figure 15B:
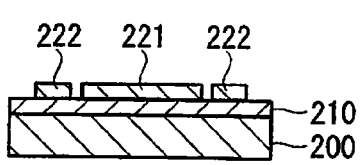
FIG. 15B is a cross-sectional view for explaining the second step of the manufacturing method of the condenser microphone.
Figure 15C:
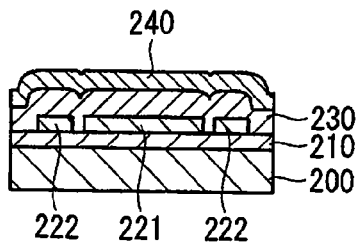
FIG. 15C is a cross-sectional view for explaining the third step of the manufacturing method of the condenser microphone.
Figure 15D:
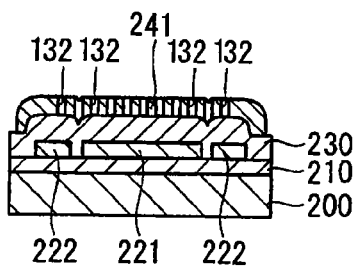
FIG. 15D is a cross-sectional view for explaining the fourth step of the manufacturing method of the condenser microphone.
Figure 15E:
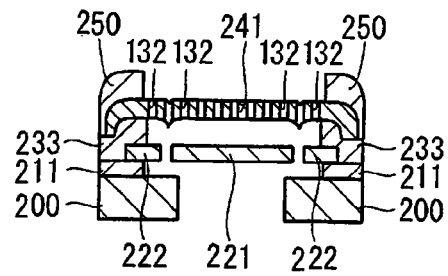
FIG. 15E is a cross-sectional view for explaining the fifth step of the manufacturing method of the condenser microphone.
Figure 15F:
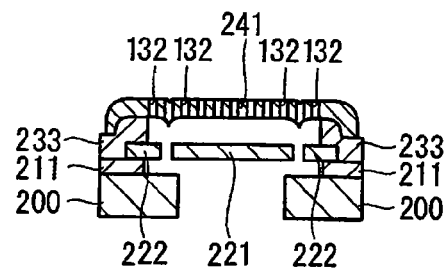
FIG. 15F is a cross-sectional view for explaining the sixth step of the manufacturing method of the condenser microphone.

In a fifth step (see (A5), i.e., FIG. 14E), similar to the manufacturing method of the condenser microphone 101, the opening 202 corresponding to the opening 142 defined by the supports 140 is formed in the substrate 200. In a sixth step (see (A6), i.e., FIG. 14F), similar to the manufacturing method of the condenser microphone 101, the insulating films 210 and 230 are partially removed so as to form various portions of the condenser microphone 202.

As described heretofore, the present embodiment can be applied to any types of diaphragms having bent portions and any types of condenser microphones whose diaphragms have bent portions. Of course, the present invention is not necessarily applied to sensors for detecting sound pressure and can be applied to any types of pressure sensors having diaphragms.

The present embodiment is described in such a way that after the formation of the first film (i.e., the conductive films 221 and 222) and the third film (i.e., the conductive film 242), the aforementioned insulating films are partially removed so as to form the second film (i.e., the insulating films 231 and 232); but this is not a restriction. In short, it is possible to freely form the first, second, and third films in a desired order.

3. Third Embodiment

Figure 17A:
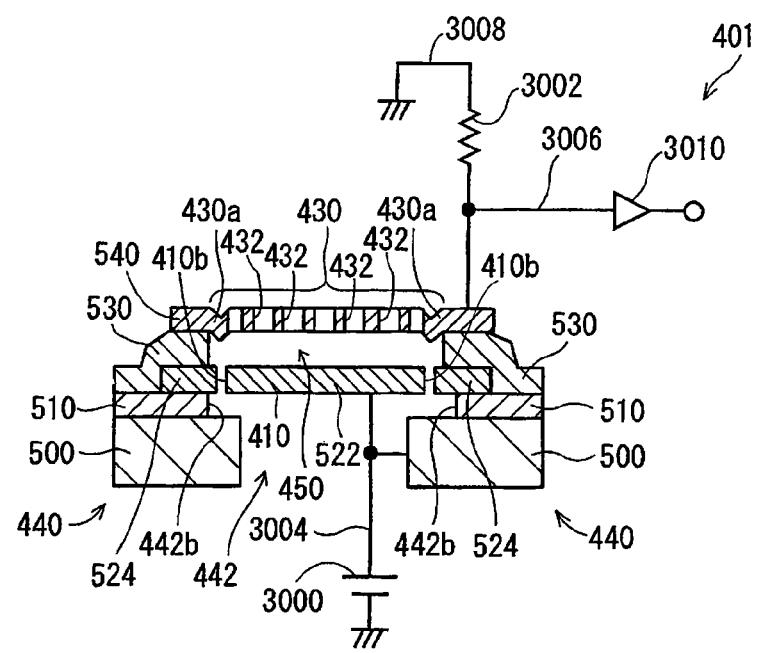
FIG. 17A is a cross-sectional view taken along line A1-A1 in FIG. 18A.
Figure 17B:
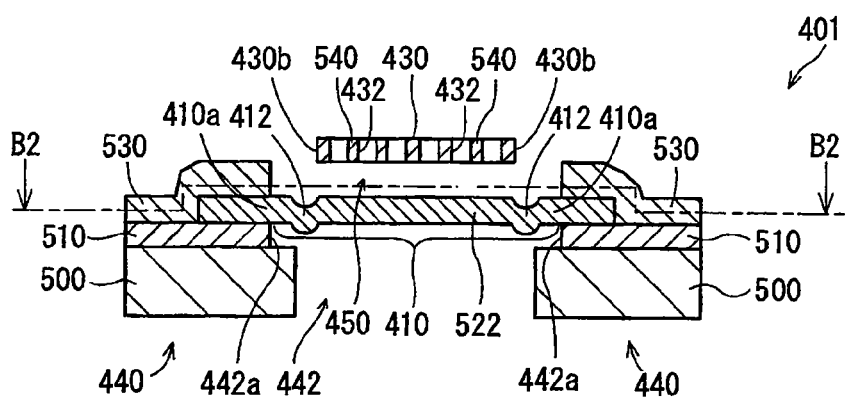
FIG. 17B is a cross-sectional view taken along line B1-B1 in FIG. 18A.
Figure 18A:
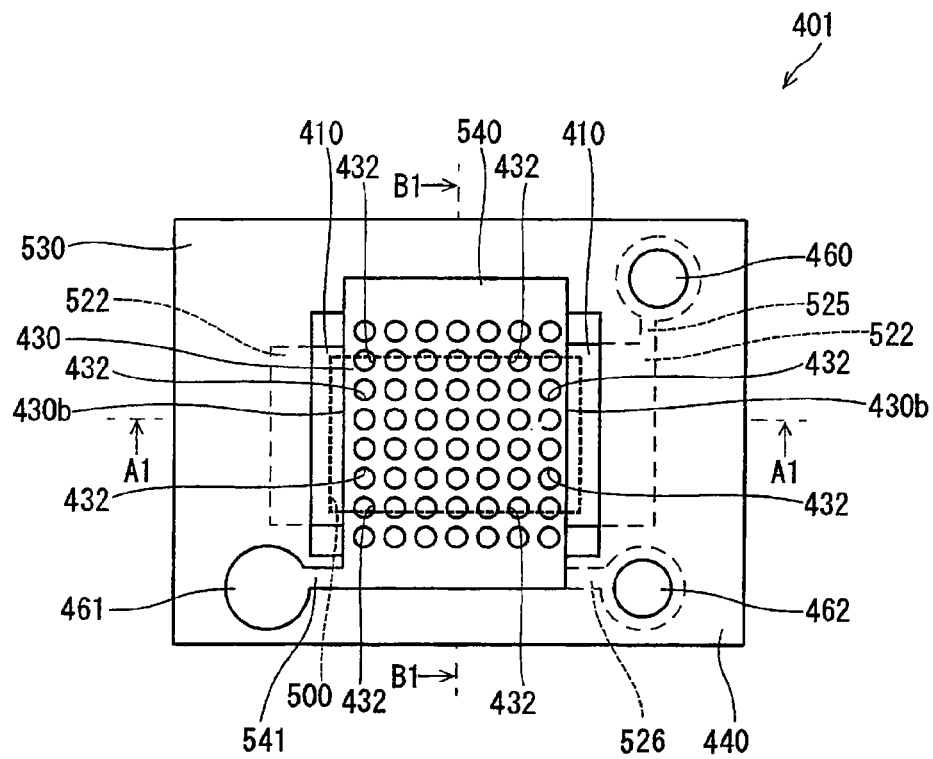
FIG. 18A is a plan view showing a condenser microphone in accordance with a third embodiment of the present invention.
Figure 18B:
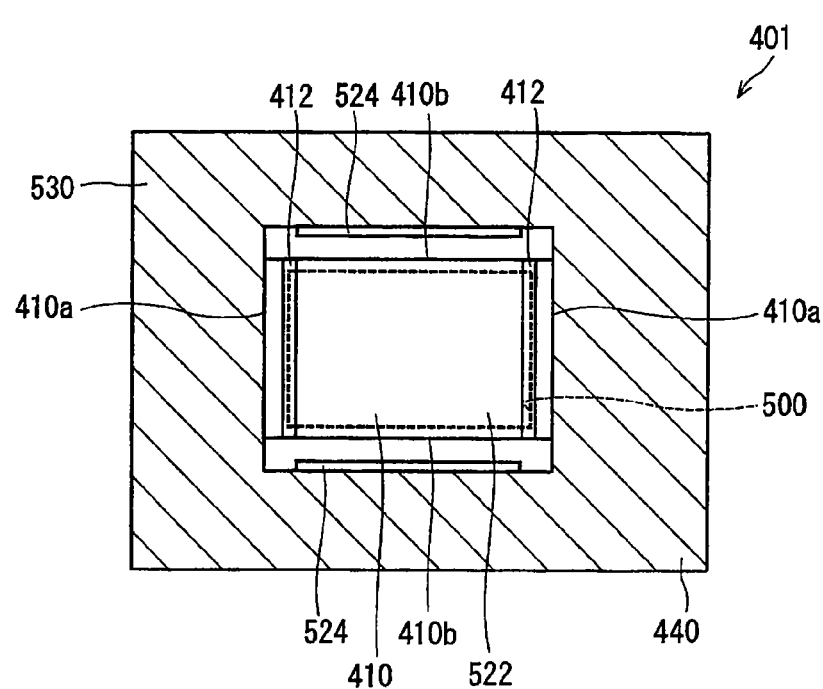
FIG. 18B is a cross-sectional view taken along line B2-B2 in FIG. 17B.

FIGS. 17A, 17B, 18A, and 18B show the constitution of a condenser microphone 401 in accordance with a third embodiment of the present invention, wherein FIG. 17A is a cross-sectional view take along line B1-B1 in FIG. 18A; FIG. 17B is a cross-sectional view taken along line A1-A1 in FIG. 18A; and FIG. 18B is a cross-sectional view taken along line B2-B2 in FIG. 17B.

Similar to the aforementioned condenser microphones 1 and 101, the condenser microphone 401 is a silicon capacitor microphone that is produced by way of the semiconductor manufacturing process. The condenser microphone 401 includes a sensing portion (see FIGS. 17A and 17B) and a detecting portion (see the circuitry shown in FIG. 17A).

(a) Constitution of Sensing Portion

As shown in FIGS. 17A and 17B, the sensing portion of the condenser microphone 401 includes a diaphragm 410, a back plate 430, and supports 440.

The diaphragm 410 is formed by a prescribed portion of a conductive film 522, both ends of which come in contact with an insulating film 510. The conductive film 522 is a semiconductor film composed of polycrystal silicon (or polysilicon), for example. The conductive film functions as a moving electrode as well. The diaphragm 410 has a rectangular shape, both ends of which are supported by the supports 440.

Specifically, long-side ends 410a of the diaphragm 410 lying in the long-side direction are fixed to the supports 440 (see FIG. 17B) while short-side ends 410b of the diaphragm 410 lying in the short-side direction are not fixed to and free from the supports 440 (see FIG. 17A). An opening 442 is formed between the supports 440 and is defined by wall surfaces 442a (see FIG. 17B), which are positioned opposite to each other, and other wall surfaces 442b (see FIG. 17A), which are positioned opposite to each other and which are positioned adjacent to the wall surfaces 442a respectively. The long-side ends 410a of the diaphragm 410 are fixed to the wall surfaces 442a while the short-side ends 410b are not fixed to and free from the wall surfaces 442b. That is, the diaphragm 410 is bridged across the supports 440 in the longitudinal direction thereof. This makes it possible for the diaphragm 410 to vibrate with relatively large amplitude due to sound waves.

Figure 19A:
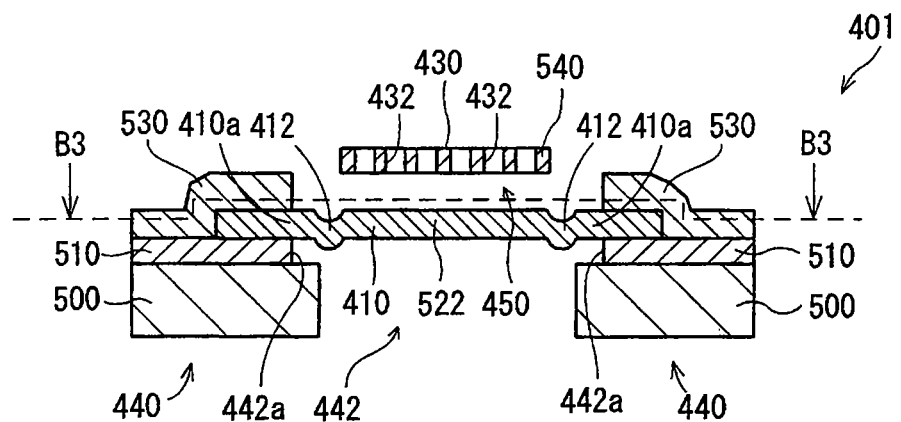
FIG. 19A is a cross-sectional view showing that long-side ends of a diaphragm included in the condenser microphone are curved.
Figure 19B:
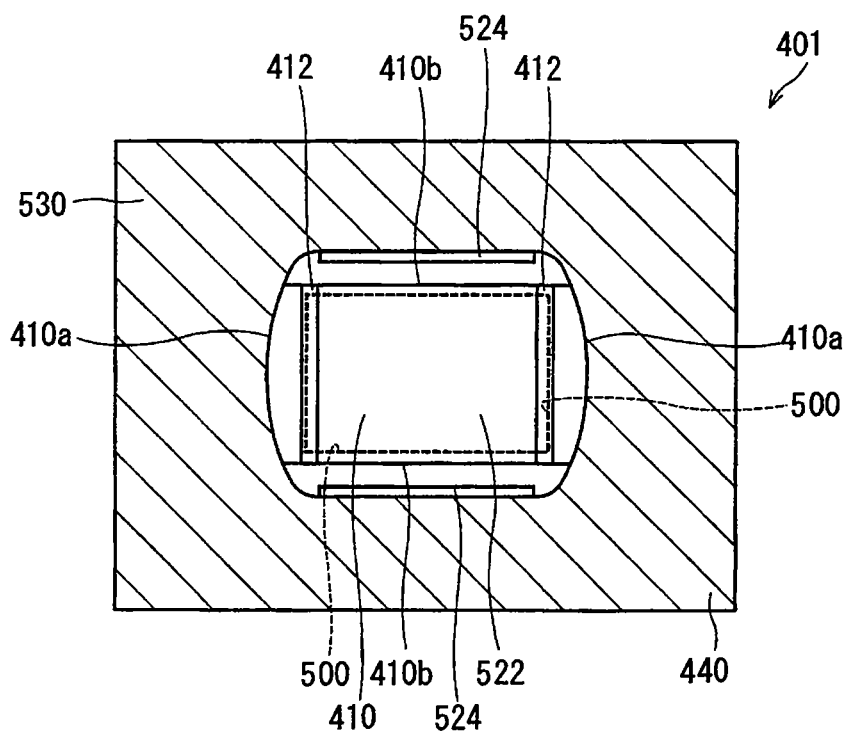
FIG. 19B is a horizontal sectional view taken along line B3-B3 in FIG. 19A.
Figure 20A:
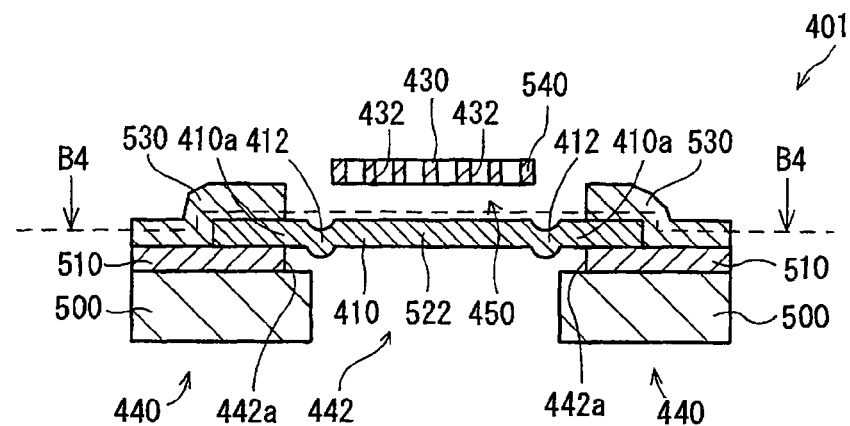
FIG. 20A is a cross-sectional view showing that short-side ends of the diaphragm included in the condenser microphone are curved.
Figure 20B:
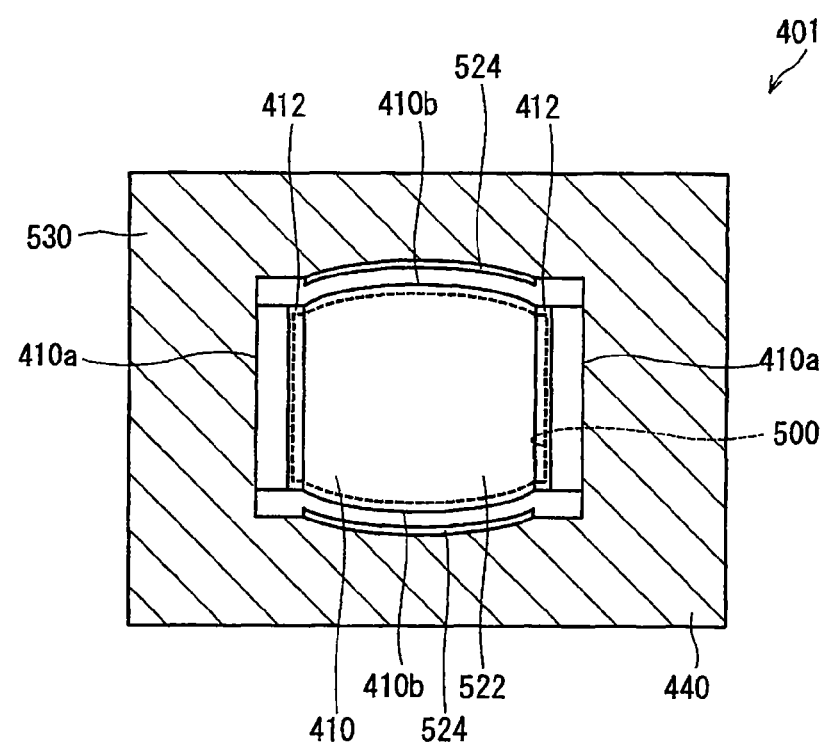
FIG. 20B is a horizontal sectional view taken along line B4-B4 in FIG. 20A.

The diaphragm 410 is not necessarily designed in a rectangular shape; hence, it can be designed in a square shape or other shapes. For example, as shown in FIGS. 19A and 19B, the long-side ends 410a of the diaphragm 410 can be curved with a certain curvature. Alternatively, as shown in FIGS. 20A and 20B, the short-side ends 410b of the diaphragm 410 can be curved with a certain curvature. In addition, the short sides of the diaphragm 410 can be bridged across the supports 440. Anyway, the diaphragm 410 can be arbitrarily bridged across the supports 440 in a prescribed bridging direction, which may match the short-side direction or long-side direction of the diaphragm 410.

The diaphragm 410 has springs 412, which are waved and extended in the long-side direction from the center portion of the diaphragm 410 to the long-side ends 410a. The springs 412 absorb the residual stress of the center portion of the diaphragm 410 by way of deformation thereof. Specifically, the springs 412 are stretched due to the tensile stress applied to the center portion of the diaphragm 410, or they are contracted due to the compressive stress applied to the center portion of the diaphragm 410. The springs 412 can be formed in any shapes as long as they are capable of absorbing the residual stress of the center portion of the diaphragm 410 by way of the deformation thereof. For example, the springs 412 can be waved in two-dimensional directions along the diaphragm 410.

The back plate 430 is formed using the prescribed portion of a conductive film 540. The conductive film 540 is a semiconductor film composed of polysilicon, for example. The conductive film 540 functions as a fixed electrode as well. The back plate 430 has a rectangular shape, both ends of which are supported by the supports 440. The back plate 430 three-dimensionally crosses the diaphragm 410 inwardly of the long-side ends 410a.

Specifically, long-side ends 430a of the back plate 430 are fixed at the wall surfaces 442b of the opening 442 (see FIG. 17A), while short-side ends 430b of the back plate 430 are positioned to be free from the wall surfaces 442a of the opening 442 (see FIG. 17B). That is, the short-side ends 430b of the back plate 430 are distanced from and not positioned opposite to the "fixed" long-side ends 410a of the diaphragm 410. This reduces the unchanged amount of capacity existing between the diaphragm 410 and the back plate 430; hence, it is possible to increase the sensitivity of the condenser microphone 401.

The back plate 430 has a plurality of holes 432. Sound waves radiated from a sound source (not shown) propagate through the holes 432 of the back plate 430 and are then transmitted to the diaphragm 410. The back plate 430 is not necessarily formed in the rectangular shape; hence, it can be arbitrarily formed in any types of shapes. Incidentally, the back plate 430 can be freely bridged across the supports 440 in a desired manner. For example, the back plate 430 can be bridged across the supports 440 in the short-side direction thereof; alternatively, the periphery of the back plate 430 can be entirely fixed to the supports 440.

The supports 440 are constituted of the prescribed portion of the conductive film 540 fixed to the insulating film 530 and the prescribed portion of a conductive film 522 fixed to the insulating film 510 as well as the insulating film 530, a conductive film 524, the insulating film 510, and a substrate 500. Both of the insulating films 510 and 530 are oxide films composed of $SiO_2$; the conductive film 524 is a semiconductor film composed of polysilicon; and the substrate 500 is a monocrystal silicon substrate. The opening 442 is defined by the supports 440 so as to run through the substrate 500 and the insulating film 510. A back cavity of the condenser microphone 401 is formed by means of the opening 442 and the diaphragm 410.

An electrode 460 shown in FIG. 18A connects the diaphragm 410 and the detecting portion together. The electrode 460 is connected to the conductive film 522 via a lead 525, which extends from the electrode 460 to the conductive film 522. An electrode 461 connects the back plate 430 and the detecting portion. The electrode 461 is connected to the conductive film 540 via a lead 541, which extends from the electrode 461 to the conductive film 540.

Figure 25A:
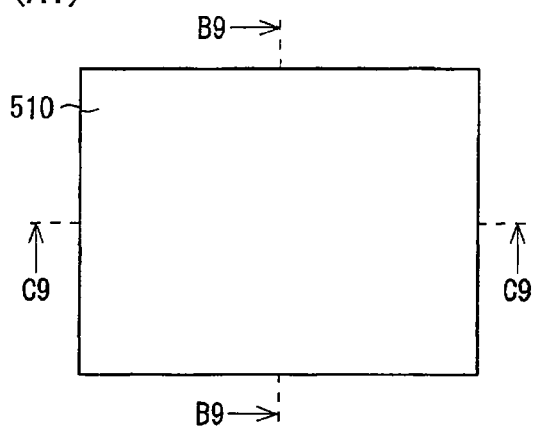
FIG. 25A is a plan view for explaining a first step of a manufacturing method of the condenser microphone.
Figure 25B:
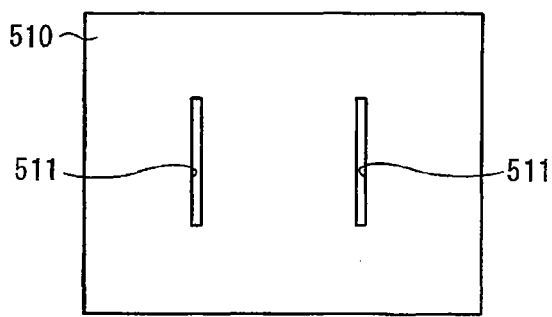
FIG. 25B is a plan view for explaining a second step of the manufacturing method of the condenser microphone.
Figure 25C:
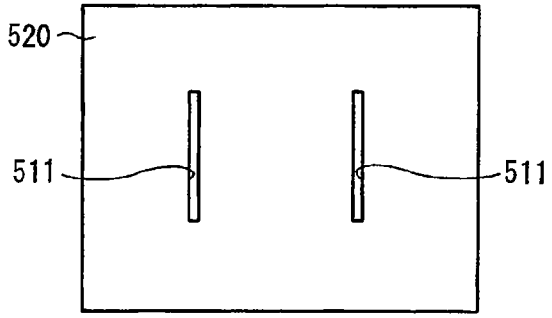
FIG. 25C is a plan view for explaining a third step of the manufacturing method of the condenser microphone.
Figure 25D:
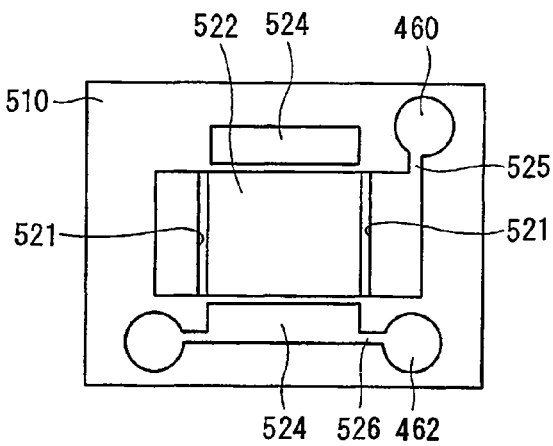
FIG. 25D is a plan view for explaining a fourth step of the manufacturing method of the condenser microphone.

As shown in FIG. 25D (A4), an electrode 462 is connected to the conductive film 524 via a lead 526, which extends from the electrode 462 to the conductive film 524. The conductive film 524 is electrically insulated from other conductive films and is formed between the back plate 430 and the substrate 500. By applying the voltage, which is identical to the output voltage of the detecting portion, to the electrode 462, the conductive film 524 functions as a guard electrode, details of which will be described later.

The condenser microphone 401 can be redesigned in such a way that, rather than the back plate 430, the diaphragm 410 is positioned close to a sound source (not shown), wherein sound waves are directly transmitted to the diaphragm 410. In this case, the holes 432 of the back plate 430 function as passages for communicating between the back cavity and an air gap 450 formed between the diaphragm 410 and the back plate 430.

(b) Constitution of Detecting Portion

As shown in FIG. 17A, the diaphragm 410 is connected to a bias voltage circuit 3000, and the back plate 430 is grounded via a resistor 3002. The back plate 430 is connected to a pre-amplifier 3010 as well. The detecting portion of the condenser microphone 401 produces electric signals based on the voltage applied between the diaphragm 410 and the ground by way of the pre-amplifier 3010.

Specifically, a lead 3004 connected to the bias voltage circuit 3000 is connected to the electrode 460 and the substrate 500; a lead 3006 connected to one end of the resistor 3002 is connected to the electrode 461; and a lead 3008 connected to the other end of the resistor 3002 is connected to the ground, i.e., a packaging substrate of the condenser microphone 401. The resistor 3002 has relatively high resistance, which is preferably set to giga-order ohm. The lead 3006 connecting between the back plate 430 and the resistor 3002 is connected to an input terminal of the pre-amplifier 3010. It is preferable that the pre-amplifier 3010 have high input impedance.

By applying the voltage, which is identical to the output voltage of the detecting portion, to the electrode 462, the conductive film 524 serves as a guard electrode, which is used to reduce the parasitic capacitance existing between the substrate 500 and the conductive film 540 forming the back plate 430. For example, when the conductive film 524 serves as a guard electrode, the pre-amplifier 3010 (see FIG. 17A) forms a voltage-follower circuit, wherein the output terminal of the pre-amplifier 3010 is connected to the electrode 462. By placing both of the conductive film 524 and the conductive film 540 forming the back plate 430 at the same potential, it is possible to eliminate the parasitic capacitance existing between the conductive films 524 and 540, thus reducing the parasitic capacitance existing between the conductive film 540 and the substrate 500.

(c) Operation of Condenser Microphone

When sound waves propagate through the holes 432 of the back plate 430 and are transmitted to the diaphragm 410, the diaphragm 410 vibrates due to sound waves applied thereto. Due to the vibration of the diaphragm 410, the distance between the back plate 430 and the diaphragm 410 is varied, so that the electrostatic capacitance between the diaphragm 410 and the back plate 430 is varied.

As described above, the back plate 430 is connected to the resistor 3002 having relatively high resistance; hence, even when the electrostatic capacitance varies due to the vibration of the diaphragm 410, electric charges accumulated in the microphone capacity do not substantially flow through the resistor 3002. That is, it is presumed that electric charges accumulated in the microphone capacity do not substantially change. Therefore, it is possible to translate variations of electrostatic capacitance into variations of voltage between the back plate 430 and the ground.

As a result, the condenser microphone 401 produces electric signals based on very small variations of electrostatic capacitance. That is, the condenser microphone 401 converts variations of sound pressure applied to the diaphragm 410 into variations of electrostatic capacitance, which are then converted into variations of voltage, based on which the condenser microphone 401 produces electric signals in response to variations of sound pressure.

Figure 21:
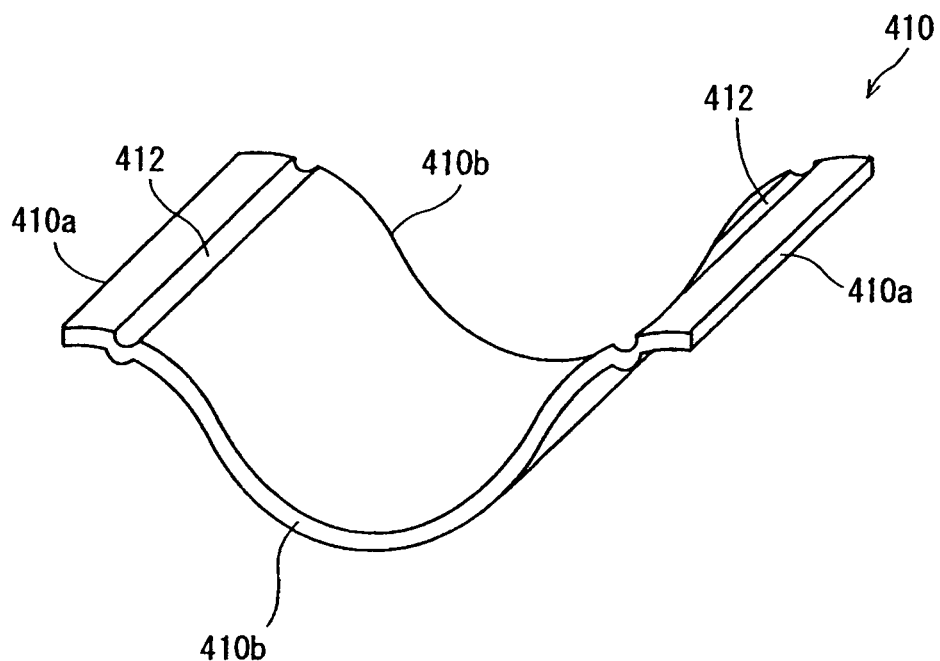
FIG. 21 is a perspective view diagrammatically showing the diaphragm, the center portion of which is curved in comparison with long-side ends thereof.

FIG. 21 diagrammatically shows the diaphragm 410, which vibrates due to sound waves applied thereto. Since both ends of the diaphragm 410 are supported by the supports 440, the diaphragm 410 is partially waved and deformed so as to vibrate due to sound waves applied thereto. The deformation of the diaphragm 410 indicates very large amplitude of displacement by which the center portion of the diaphragm 410 is greatly curved in comparison with the long-side ends 410a, that is, the amplitude of the center portion lying in the longitudinal direction becomes maximum. Due to the aforementioned vibration of the diaphragm 410, the short-side ends 410b are displaced with the same amplitude while the long-side ends 410a are fixed in position.

The displacement of the diaphragm 410, in which the long-side ends 410a are only fixed in position is larger than the displacement of the conventional diaphragm whose periphery is entirely fixed in position. Due to such a large displacement of the diaphragm 410 along the short-side ends 410b, it is possible to increase the sensitivity of the condenser microphone. As the distance between the opening 442 and the diaphragm 410 becomes large, the displacement of the short-side ends 410b becomes small in comparison with the displacement of the center portion of the diaphragm 410. In comparison with the conventional diaphragm whose periphery is entirely fixed in position, the condenser microphone 401 can realize relatively large displacement with respect to the short-side ends 410b of the diaphragm 410 due to sound waves. Even when the displacement of the short-side ends 410b becomes smaller than the displacement of the center portion of the diaphragm 410, it is possible to realize a high sensitivity with respect to the condenser microphone 401 compared with the conventionally-known condenser microphone.

Since the condenser microphone 401 is designed such that the back plate 430 is not positioned opposite to the "fixed" long-side ends 410a of the diaphragm 410, it is possible to reduce the unchanged capacity between the diaphragm 410 and the back plate 430; hence, it is possible to increase the sensitivity of the condenser microphone 401.

When the short-side width of the back plate 430 is reduced in order that the back plate 430 three-dimensionally crosses the diaphragm 410 inwardly of the long-side ends 410a, the area of the back plate 430 positioned opposite to the diaphragm 410 decreases so that the electrostatic capacitance correspondingly decreases. As a result, the condenser microphone 401 greatly receives noise, so that the S/N ratio (i.e., the signal-to-noise ratio) of the condenser microphone 401 decreases. For this reason, it is preferable that the short-side width of the back plate 430 be determined based on the S/N ratio of the condenser microphone 401.

Next, an example of determination of the short-side width of the back plate 430 based on the S/N ratio of the condenser microphone 401 will be described in detail with reference to FIGS. 22, 23, and 24.

Figure 22:
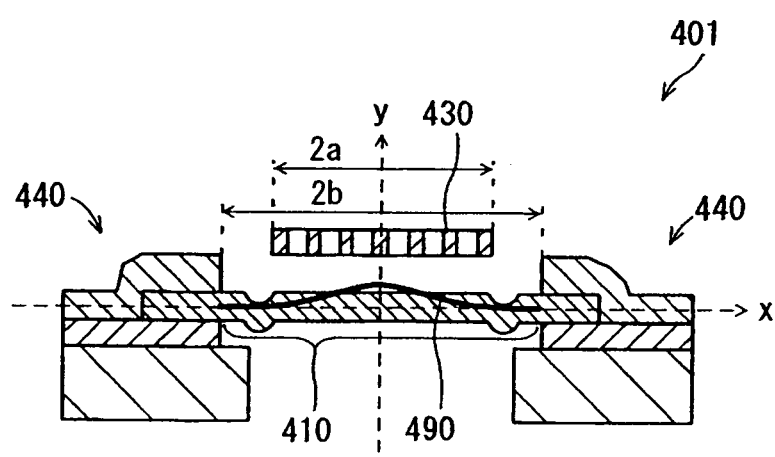
FIG. 22 is a cross-sectional view for explaining a design method for the determination of the short-side width of a back plate included in the condenser microphone based on the S/N ratio.

FIG. 22 is a cross-sectional view for explaining the relationship between the long-side width of the diaphragm 410, the short-side width of the back plate 430, and the S/N ratio of the condenser microphone 401. Suppose that the long-side direction of the diaphragm 410 is denoted as an X-axis, the thickness direction of the diaphragm 410 is denoted as a Y-axis, and the short-side direction of the diaphragm 410 is denoted as a Z-axis, whereby a three-dimensional space is defined by the X-axis, Y-axis, and Z-axis with respect to the diaphragm 410. The deformation of the diaphragm 410 (see a curve 490 in FIG. 22) is approximated in accordance with an equation (1). Herein, the center of the diaphragm 410 in its short-side direction lies on the X-axis, and both of the center of the diaphragm 410 in its long-side direction and the center of the back plate 430 in its short-side direction lie on the Z-axis. In addition, the short-side width of the back plate 430 is designated by 2a, the long-side width of the diaphragm 410 is designated by 2b, and the short-side width of the diaphragm 410 is designated by 2c.

$$y(x) = dx^4 + ex^2 + f \quad (1)$$

where $-b < x < b, -c < z < c$.

Since the long-side ends 410a of the diaphragm 410 are fixed and not displaced, equations (2) and (3) are established, based on which the deformation of the diaphragm 410 is represented by an equation (4), and a sensitivity s of the condenser microphone 401 is represented by an equation (5). The sensitivity s of the condenser microphone 401 is normalized by use of a divisor d.

$$y(\pm b) = 0 \quad (2)$$

$$\frac{dy(\pm b)}{dx} = 0 \quad (3)$$

$$y(x) = d(x^4 - 2b^2 x^2 + b^4) \quad (4)$$
where $-b < x < b, -c < z < c$.

$$s(a) = \frac{1}{d} \times \frac{\int_{-a}^{a} y(x) dx \times c}{2ac} = \frac{a^4}{5} - \frac{2b^2 a^2}{3} + b^4 \quad (5)$$

Figure 23:
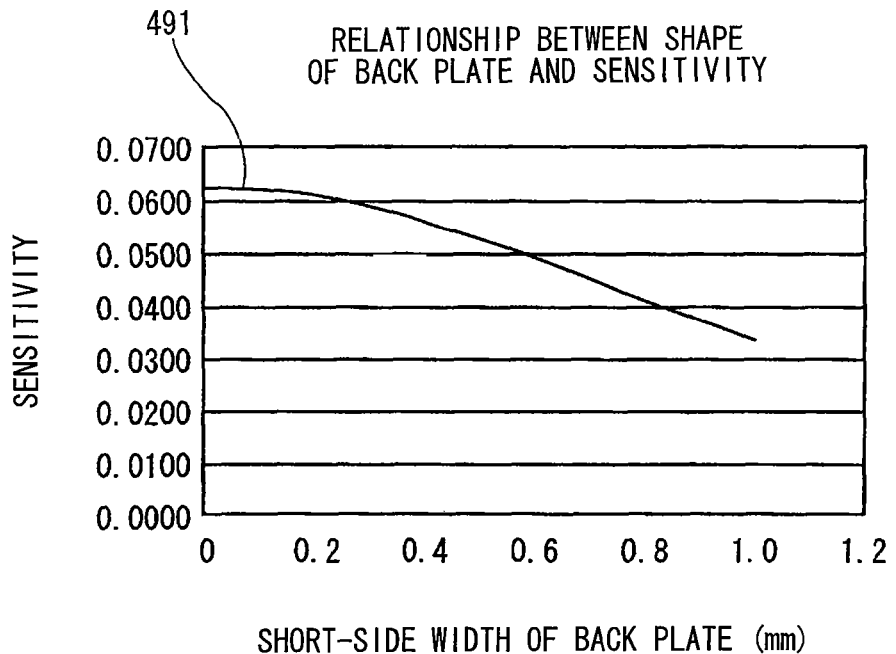
FIG. 23 is a graph showing the relationship between the short-side width of the back plate and the sensitivity of the condenser microphone.

FIG. 23 is a graph showing the relationship between the short-side width of the back plate 430 and the sensitivity of the condenser microphone 401. Herein, a curve 491 shows variations of the sensitivity s when the long-side width 2b of the diaphragm 410 is set to 1.0 mm, and the short-side width 2a of the back plate 430 is varied from 0 mm to 1.0 mm. The curve 491 clearly shows that the sensitivity s increases as the short-side width 2a of the back plate 430 decreases.

However, when the short-side width 2a of the back plate 430 decreases, the electrostatic capacitance between the diaphragm 410 and the back plate 430 correspondingly decreases; hence, noise n, which is inversely proportional to the square root of the electrostatic capacitance, increases in accordance with an equation (6).

$$n(a) = \frac{1}{\sqrt{2a}} \quad (6)$$

As a result, it is preferable that the short-side width of the back plate 430 be determined in accordance with the S/N ratio of the condenser microphone 401 (see an equation (7)).

$$SN(a) = \frac{s(a)}{n(a)} = \sqrt{2}\left(\frac{a^{4.5}}{5} - \frac{2b^2 a^{2.5}}{3} + b^4 a^{0.5}\right) \quad (7)$$

Figure 24:
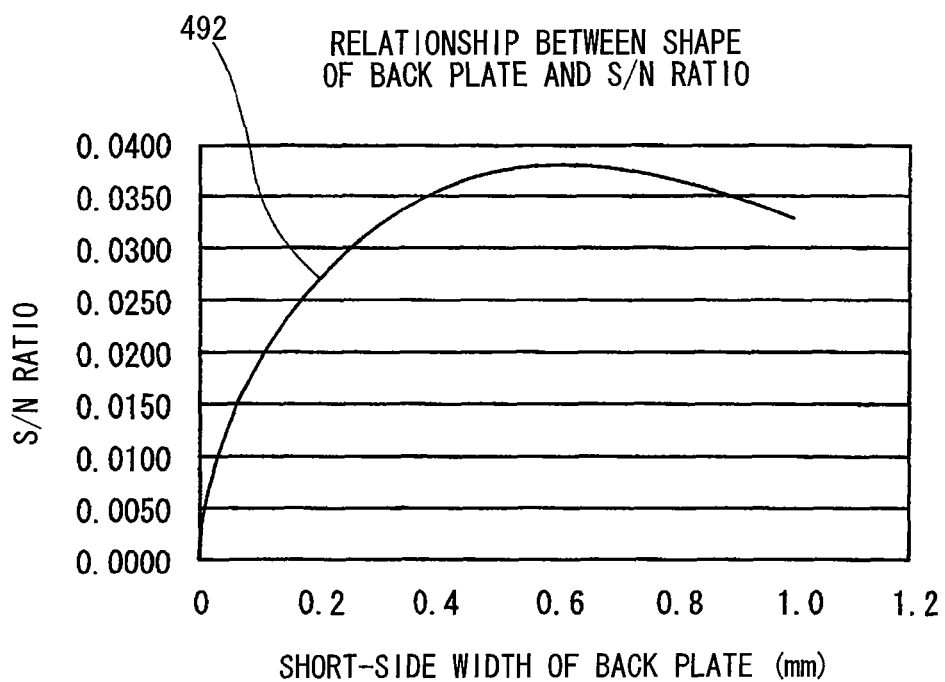
FIG. 24 is a graph showing the relationship between the short-side width of the back plate and the S/N ratio of the condenser microphone.

FIG. 24 is a graph showing the relationship between the short-side width of the back plate 430 and the S/N ratio of the condenser microphone 401. A curve 492 shows variations of the S/N ratio when the long-side width 2b of the diaphragm 410 is set to 1.0 mm, and the short-side width 2a of the back plate 430 is varied from 0 mm to 1.0 mm. The curve 492 clearly shows that the S/N ratio of the condenser microphone 401 has a maximal value in relation to the short-side width 2a of the back plate 430. The value of the short-side width 402a of the back plate 430, which produces the maximal value of the S/N ratio of the condenser microphone 401, can be calculated by determining "a" based on the equation (7) in which the linear differential becomes zero.

As a result, when the short-side width 402a of the back plate 430 is 0.6 times smaller than the long-side width 2b of the diaphragm 410, the S/N ratio of the condenser microphone 401 becomes maximal. That is, when the long-side width 2b of the diaphragm 410 is 1.0 mm, it is preferable that the back plate 430 be positioned opposite to both-side areas of 0.3 mm width from the center of the diaphragm 410 in its long-side direction, and the back plate 430 be not positioned opposite to both-side areas of 0.2 mm width from the long-side ends 410a of the diaphragm 410. According to the aforementioned design method, the short-side width 2a of the back plate 430 can be determined based on the S/N ratio of the condenser microphone 401.

(c) Manufacturing Method

Next, the manufacturing method of the condenser microphone 401 will be described in detail with reference to FIGS. 25A to 25G, FIGS. 26A to 26G, and FIGS. 27A to 27G, wherein FIGS. 26A to 26G are cross-sectional views taken along line B9-B9 in FIG. 25A; and FIGS. 27A to 27G are cross-sectional views taken along line C9-C9 in FIG. 25A.

Figure 27A:
FIG. 27A is a cross-sectional view taken along line C9-C9 in FIG. 25A, which is used for explaining the first step of the manufacturing method of the condenser microphone.

In a first step (see (C1), i.e., FIG. 27A), an insulating film 510 is formed on a substrate 500, which is a semiconductor substrate such as a monocrystal silicon substrate. Specifically, an insulating material is deposited on the surface of the substrate 500 by way of CVD, thus forming the insulating film 510 on the substrate 500.

Figure 27B:
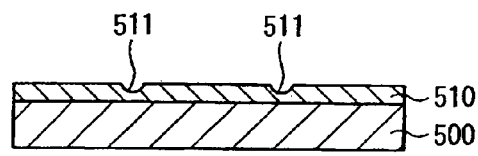
FIG. 27B is a cross-sectional view for explaining the second step of the manufacturing method of the condenser microphone.

In a second step (see (A2) and (C2), i.e., FIGS. 25B and 27B), linear recesses 511 are formed on the insulating film 510. Specifically, a resist film for exposing prescribed portions of the insulating film 510, which are used for the formation of the linear recesses 511, is formed on the insulating film 510 by way of lithography. That is, a resist is applied to the insulating film 510 so as to form the aforementioned resist film. By use of a mask having a prescribed shape, the resist film is subjected to exposure and development, thus removing the unnecessary portion of the resist film. Thus, it is possible to form the resist film, which exposes the prescribed portions of the insulating film 510 used for the formation of the linear recesses 511, on the insulating film 510. Next, the exposed portion of the insulating film 510, which is exposed from the resist film, is subjected to etching such as RIE, thus forming the linear recesses 511 in the insulating film 510. Thereafter, the resist film is completely removed.

Figure 27C:
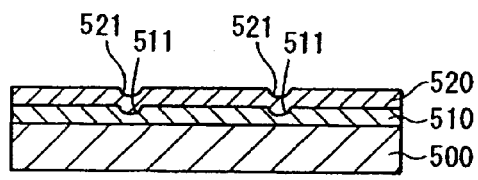
FIG. 27C is a cross-sectional view for explaining the third step of the manufacturing method of the condenser microphone.
Figure 27D:
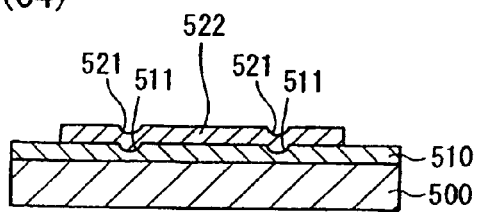
FIG. 27D is a cross-sectional view for explaining the fourth step of the manufacturing method of the condenser microphone.

In a third step (see (C3), i.e., FIG. 27C), a conductive film 520 is formed on the insulating film 510 by way of CVD. The conductive film 520 is a polysilicon film, for example.

In a fourth step (see (A4), i.e., FIG. 25D), the conductive film 520 is subjected to patterning, thus forming conductive films 522 and 524, leads 525 and 526, and electrodes 460 and 462. Specifically, the conductive film 520 is subjected to patterning in such a way that a resist film for exposing the unnecessary portion of the conductive film 520 is formed on the conductive film 520 by way of lithography, then, the exposed portion of the conductive film 520, which is exposed from the resist film, is subjected to etching such as RIE, thus forming the conductive films 522 and 524, the leads 525 and 226, and the electrodes 460 to 462. Thereafter, the resist film is completely removed.

The conductive film 522 has a rectangular shape, in which the prescribed portions of the conductive film 522 corresponding to the linear recesses 511 are waved. The waved portions of the conductive film 522 correspond to the springs 412 of the diaphragm 410. The conducive film 524 is formed in correspondence with the shape and position of the conductive film 540 in order that the conductive film 524 is positioned opposite to the conductive film 540 in the following step.

In the above, the springs 412 of the diaphragm 410 are formed by way of the formation of the conductive film 522 on the insulating film 510 having the linear recesses 511; but this is not a restriction. That is, the springs 412 can be formed by way of any types of methods. For example, the springs 412 can be formed by way of the formation of the conductive film 522 on the insulating film 510 having linear projections. Alternatively, the springs 412 can be formed by laminating thin films.

Figure 27E:
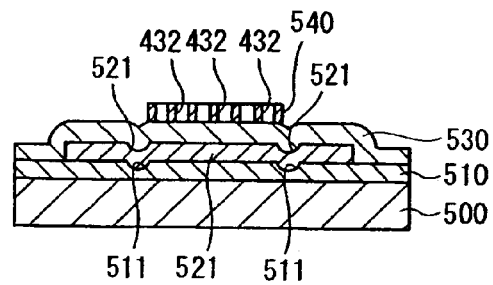
FIG. 27E is a cross-sectional view for explaining the fifth step of the manufacturing method of the condenser microphone.

In a fifth step (see (C5), i.e., FIG. 27E), the insulating film 530 whose thickness is larger than the thickness of the conductive film 520 is formed on the insulating film 510 by way of CVD. In order to selectively remove the insulating films 510 and 530 from the conductive films 522 and 524 in the following step, the insulating films 510 and 530 are composed of a prescribed material whose selection ratio is higher than that of the material of the conductive films 522 and 524. For example, when the conductive films are composed of polysilicon, the insulating films are composed of $SiO_2$. In the selective removal step of the insulating films from the conductive films, it is necessary to leave a certain portion of the insulating films forming the condenser microphone 401 even when the insulating films are partially removed; hence, it is preferable that both of the insulating films 510 and 530 be composed of the same material, by which it is possible to set the same etching rate for them. This makes it possible to easily control the amount of etching with respect to the insulating films.

Figure 25E:
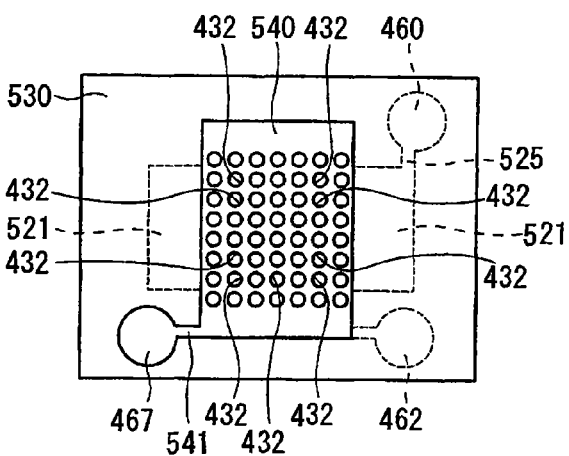
FIG. 25E is a plan view for explaining a fifth step of the manufacturing method of the condenser microphone.
Figure 25F:
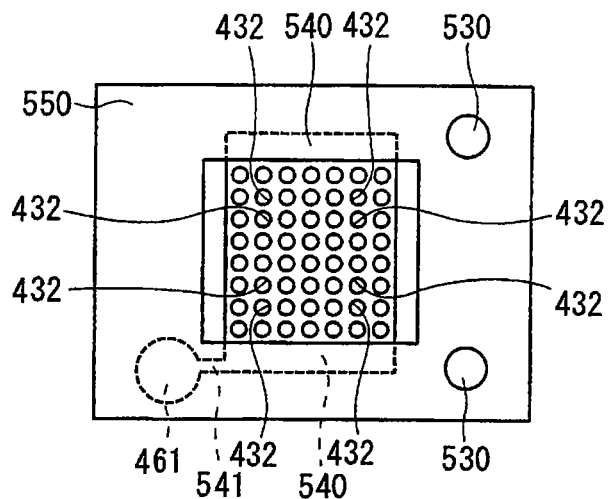
FIG. 25F is a plan view for explaining a sixth step of the manufacturing method of the condenser microphone.
Figure 25G:
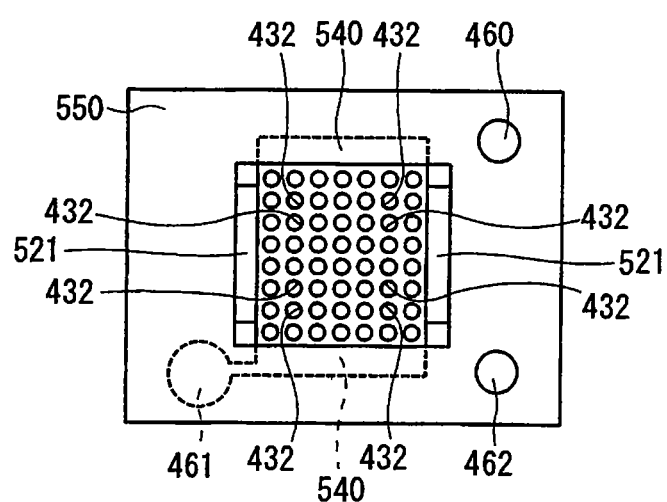
FIG. 25G is a plan view for explaining a seventh fourth step of the manufacturing method of the condenser microphone.
Figure 26A:
FIG. 26A is a cross-sectional view taken along line B9-B9 in FIG. 25A, which is used for explaining the first step of the manufacturing method of the condenser microphone.
Figure 26B:
FIG. 26B is a cross-sectional view for explaining the second step of the manufacturing method of the condenser microphone.
Figure 26C:
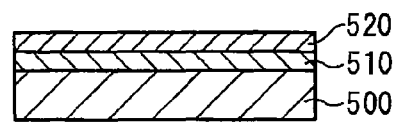
FIG. 26C is a cross-sectional view for explaining the third step of the manufacturing method of the condenser microphone.
Figure 26D:
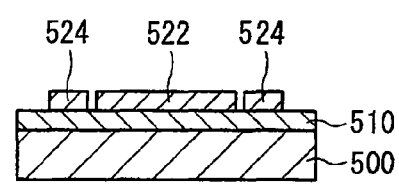
FIG. 26D is a cross-sectional view for explaining the fourth step of the manufacturing method of the condenser microphone.
Figure 26E:
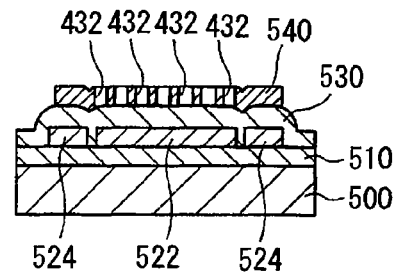
FIG. 26E is a cross-sectional view for explaining the fifth step of the manufacturing method of the condenser microphone.
Figure 26F:
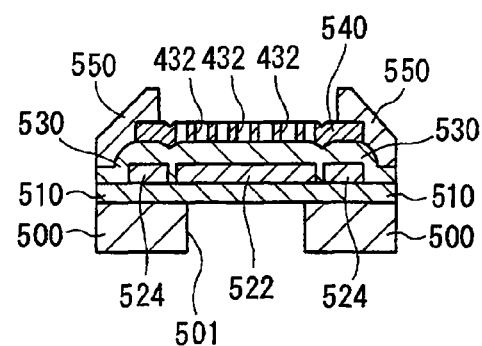
FIG. 26F is a cross-sectional view for explaining the sixth step of the manufacturing method of the condenser microphone.
Figure 26G:
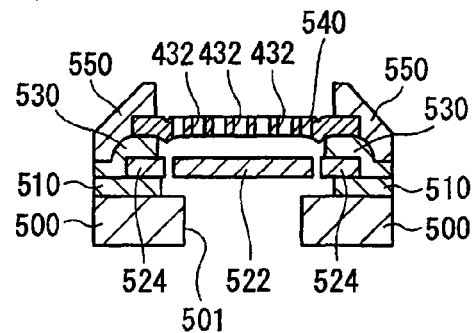
FIG. 26G is a cross-sectional view for explaining the seventh step of the manufacturing method of the condenser microphone.

Next, the conductive films 540, the lead 541, and the electrode 462 forming the back plate 430 are formed on the insulating film 530 (see (A5), i.e., FIG. 25E). All of the conductive film 540, the lead 541, and the electrode 462 are polysilicon films. Specifically, the conductive film is formed on the insulating film 530 by way of CVD; then, the conductive film is subjected to patterning so as to precisely form the conductive film 540, the lead 541, and the electrode 462. Herein, the conductive film 540 has a rectangular shape, which three-dimensionally crosses the conductive film 522 via the insulating film 530.

Figure 27F:
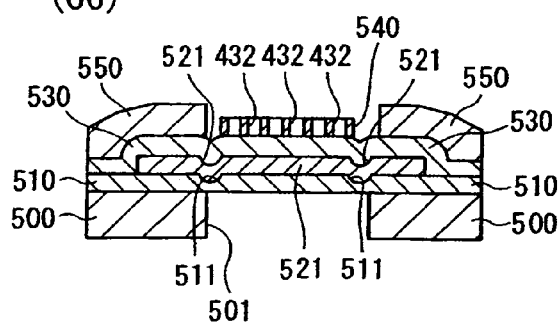
FIG. 27F is a cross-sectional view for explaining the sixth step of the manufacturing method of the condenser microphone.

In a sixth step (see (C6), i.e., FIG. 27F), an opening 501 corresponding to the opening 442 defined by the supports 440 is formed in the substrate 500. Specifically, a resist film for exposing the prescribed portion of the substrate 500 corresponding to the opening 500 is formed by way of lithography; then, the exposed portion of the substrate 500, which is exposed from the substrate 500, is removed by way of Deep RIE, by which the etching is performed to reach the insulating film 510; thereafter, the resist film is completely removed.

Figure 27G:
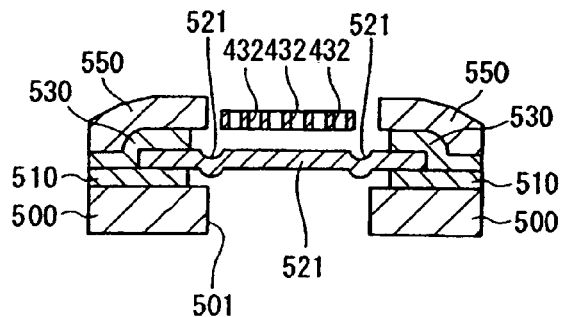
FIG. 27G is a cross-sectional view for explaining the seventh step of the manufacturing method of the condenser microphone.

In a seventh step (see (C7), i.e., FIG. 27G), the insulating films are partially removed so as to precisely form various parts of the condenser microphone 401. Specifically, a resist film 550 for covering the prescribed portion, which must remain in order to form the supports 440, is formed on the insulating film 530; then, the insulating films 510 and 530 are partially removed by way of wet etching. For example, when the insulating films 510 and 530 are composed of $SiO_2$, it is possible to use an etching solution such as hydrofluoric acid.

The etching solution is infiltrated into the holes 432 and the opening 501 of the substrate 500 so as to dissolve the insulating films. For example, when the prescribed portion of the insulating film 530 existing between the conductive films 522 and 540 is dissolved, the air gap 450 is formed between the diaphragm 410 and the back plate 430, thus leaving insulating films, covered with the resist film 550 and the substrate 500 so as to form the supports 440. As described above, the insulating films 510 and 530 are partially removed so as to precisely form various parts of the condenser microphone 401, by which it is possible to produce the sensing portion of the condenser microphone 401.

Figure 28A:
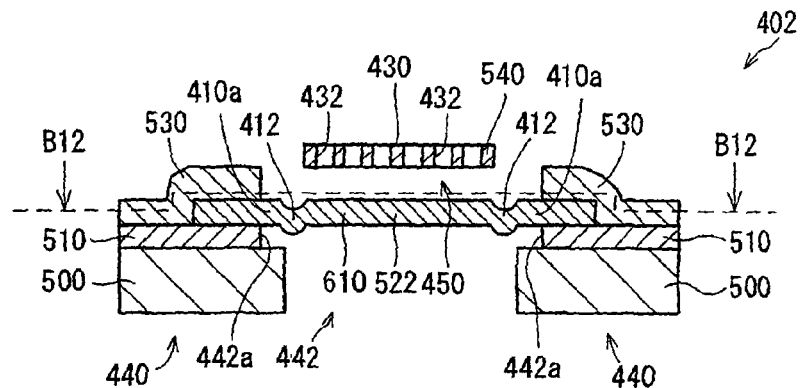
FIG. 28A is a cross-sectional view showing the constitution of a condenser microphone in accordance with a variation of the third embodiment.
Figure 28B:
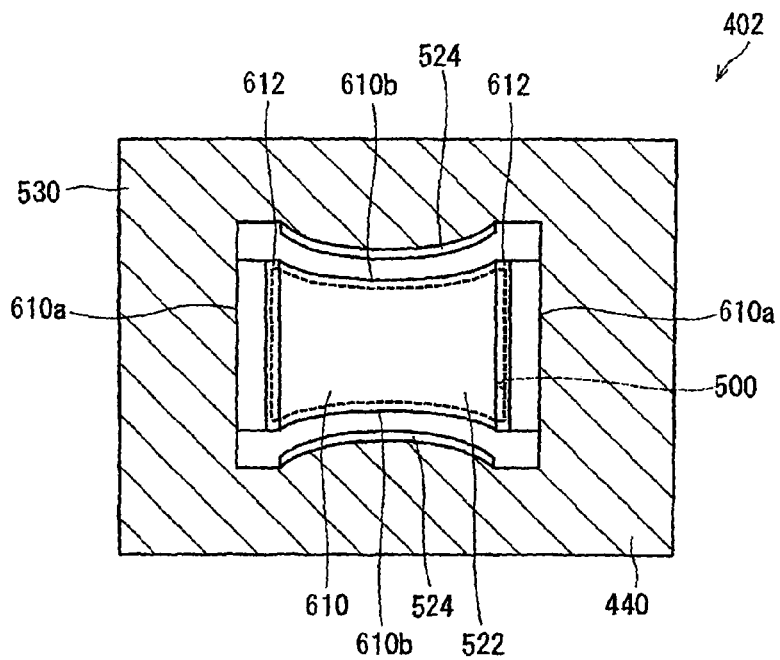
FIG. 28B is a horizontal sectional view taken along line B12-B12 in FIG. 28A.

The third embodiment can be further modified in a variety of ways. A condenser microphone 402 according to a variation of the third embodiment will be described with reference to FIGS. 28A and 28B, wherein FIG. 28B is a horizontal sectional view taken along line B12-B12 in FIG. 28A. Except for the shaping of a diaphragm 610, the constitution of the condenser microphone 402 is substantially identical to the constitution of the condenser microphone 401.

As shown in FIG. 28B, the diaphragm 610 has a rectangular shape defined by long-side ends 610a and short-side ends 610b, wherein the long-side ends 610a are fixed in position, while the short-side ends 610b are inwardly curved and are positioned to be free from the supports 440. Herein, the short-side width of the diaphragm 610 defined between the short-side ends 610b is reduced as it departs from the long-side ends 610a fixed to the supports 440. The diaphragm 610 has springs 612, which are substantially identical to the springs 412 of the diaphragm 410 included in the condenser microphone 401.

Figure 29:
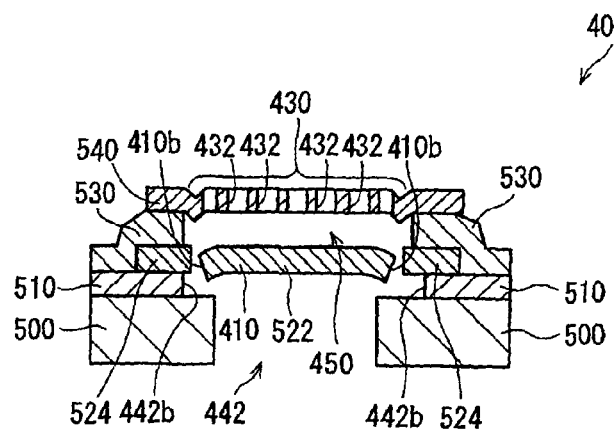
FIG. 29 is a cross-sectional view of the condenser microphone, which is used for explaining a minor problem with regard to the diaphragm.

In the condenser microphone 401, the residual stress applied to the near-end portion of the diaphragm 410, which is close to the short-side ends 410b positioned free from the supports 440, is reduced so that it may be slightly lowered in position in an inward direction (see FIG. 29). In contrast, the condenser microphone 402 is characterized in the shape of the diaphragm 610 in which the short-side ends 610b are inwardly curved so as to prevent the near-end portion (close to the short-side ends 610b) from being unexpectedly lowered in position.

Lastly, the present invention is not necessarily limited to the aforementioned embodiments and variations, which are illustrative and not restrictive; hence, the condenser microphones can be further modified within the scope of the invention as defined in the appended claims.

Industrial Applicability

The present invention is applicable to condenser microphones adapted to audio devices, communication devices, and information devices, such as personal computers and cellular phones.

The invention claimed is:

1. A diaphragm, comprising:
a central portion defined by a first semiconductor layer located in a first plane, the central portion having an outer periphery;
a peripheral portion spaced from, and located outside of, the outer periphery of the central portion, the peripheral portion being defined by a second semiconductor layer located in the first plane; and
a bent portion coupling the central and peripheral portions, the bent portion including a third semiconductor layer located in a second plane which is spaced from the first plane, and a first insulating film connecting the third semiconductor layer to the central portion of the diaphragm and a second insulating film connecting the third semiconductor layer to the peripheral portion of the diaphragm.

2. The diaphragm according to claim 1, wherein the central portion has a rectangular outer periphery and the peripheral portion is located outside opposite sides of the rectangle.

3. A diaphragm, comprising:
a central portion defined by a first semiconductor layer located in a first plane, the central portion having an outer periphery;
first and second peripheral portions being spaced from, and located outside of, the outer periphery of the central portion, the first and second peripheral portions being defined by respective semiconductor layers located in the first plane and outside the outer periphery of the first layer; and
first and second bent portions respectively coupling the first and second peripheral portions to the central portion, each of the bent portions including a respective third semiconductor layer located in a second plane which is spaced from the first plane, and a respective first insulating film connecting its respective third semiconductor layer to the central portion of the diaphragm and a respective second insulating film connecting its respective third semiconductor layer to the peripheral portion of the diaphragm.

4. The diaphragm according to claim 3, wherein the central portion has a rectangular outer periphery and the peripheral portions are located outside opposite sides of the rectangle.

5. A condenser microphone, comprising:
a plate having a fixed electrode; and
a flexible diaphragm which vibrates in response to sound waves applied thereto, the flexible diaphragm including:
a central portion defined by a first semiconductor layer located in a first plane, the central portion having an outer periphery;
a peripheral portion spaced from, and located outside of, the outer periphery of the central portion, the peripheral portion being defined by a second semiconductor layer located in the first plane; and
a bent portion coupling the central and peripheral portions, the bent portion including a third semiconductor layer located in a second plane which is spaced from the first plane, a first insulating film connecting the third semiconductor layer to the central portion of the diaphragm and a second insulating film connecting the third semiconductor layer to the peripheral portion of the diaphragm.

6. The condenser microphone of claim 5, wherein the central portion has a rectangular outer periphery and the peripheral portion is located on opposite sides of the rectangle.

7. A condenser microphone, comprising:
a plate having a fixed electrode;
a flexible diaphragm which vibrates in response to sound waves applied thereto, the flexible diaphragm including:
a central portion defined by a first semiconductor layer located in a first plane, the central portion having an outer periphery;
first and second peripheral portions being spaced from, and located outside of, the outer periphery of the central portion, the first and second peripheral portions being defined by respective semiconductor layers located in the first plane and outside the outer periphery of the first layer; and
first and second bent portions respectively coupling the first and second peripheral portions to the central portion, each of the bent portions including a respective third semiconductor layer located in a second plane which is spaced from the first plane, a respective first insulating film connecting its respective third semiconductor layer to the central portion of the diaphragm and a respective second insulating film connecting its respective third semiconductor layer to the peripheral portion of the diaphragm.

8. The diaphragm according to claim 7, wherein the central portion has a rectangular outer periphery and the peripheral portions are located outside opposite sides of the rectangle.

* * * * *